(12) United States Patent
Chow et al.

(10) Patent No.: US 7,877,542 B2
(45) Date of Patent: Jan. 25, 2011

(54) HIGH INTEGRATION OF INTELLIGENT NON-VOLATILE MEMORY DEVICE

(75) Inventors: David Q. Chow, San Jose, CA (US); I-Kang Yu, Palo Alto, CA (US); Siew Sin Hiew, San Jose, CA (US); Abraham Chih-Kang Ma, Fremont, CA (US); Ming-Shiang Shen, Taipei Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 521 days.

(21) Appl. No.: 12/054,310

(22) Filed: Mar. 24, 2008

(65) Prior Publication Data

US 2008/0215802 A1    Sep. 4, 2008

Related U.S. Application Data

(60) Continuation-in-part of application No. 12/035,398, filed on Feb. 21, 2008, which is a continuation-in-part of application No. 11/770,642, filed on Jun. 28, 2007, which is a continuation-in-part of application No. 11/748,595, filed on May 15, 2007, now Pat. No. 7,471,556, which is a continuation-in-part of application No. 10/818,653, filed on Apr. 5, 2004, now Pat. No. 7,243,185, application No. 12/054,310, which is a continuation-in-part of application No. 12/025,706, filed on Feb. 4, 2008, which is a continuation-in-part of application No. 11/871,011, filed on Oct. 11, 2007, application No. 12/054,310, which is a continuation-in-part of application No. 11/996,871, filed on Jul. 18, 2008, which is a continuation-in-part of application No. 11/773,830, filed on Jul. 5, 2007, application No. 12/054,310, which is a continuation-in-part of application No. 11/309,594, filed on Aug. 28, 2006, now Pat. No. 7,383,362, which is a continuation-in-part of application No. 10/707,277, filed on Dec. 2, 2003, now Pat. No. 7,103,684, application No. 12/054,310, which is a continuation-in-part of application No. 11/624,667, filed on Jan. 18, 2007, now abandoned, which is a division of application No. 09/478,720, filed on Jan. 6, 2000, now Pat. No. 7,257,714.

(51) Int. Cl.
*G06F 12/00* (2006.01)
(52) U.S. Cl. .............................. 711/103; 711/E12.008
(58) Field of Classification Search ........................ None
See application file for complete search history.

(56) References Cited

U.S. PATENT DOCUMENTS 5,430,859 A    7/1995   Norman et al.

(Continued)

*Primary Examiner*—Reginald G Bragdon
*Assistant Examiner*—Aracelis Ruiz
(74) *Attorney, Agent, or Firm*—Roger H. Chu

(57) ABSTRACT

High integration of a non-volatile memory device (NVMD) is disclosed. According to one aspect of the present invention, a non-volatile memory device comprises an intelligent non-volatile memory (NVM) controller and an intelligent non-volatile memory module. The NVM controller includes a central processing unit (CPU) configured to handle data transfer operations to the NVM module to ensure source synchronous interface, interleaved data operations and block abstracted addressing. The intelligent NVM module includes an interface logic, a block address manager and at least one non-volatile memory array. The interface logic is configured to handle physical block management. The block address manager is configured to ensure a physical address is converted to a transformed address that is accessible to the CPU of the intelligent NVM controller. The transformed address may be an address in blocks, pages, sectors or bytes either logically or physically.

17 Claims, 26 Drawing Sheets

U.S. PATENT DOCUMENTS

| | | |
|---|---|---|
| 6,044,428 A | 3/2000 | Rayabhari |
| 6,148,354 A | 11/2000 | Ban et al. |
| 6,438,638 B1 | 8/2002 | Jones et al. |
| 6,615,404 B1 | 9/2003 | Garfunkel et al. |
| 6,721,843 B1 * | 4/2004 | Estakhri .................... 711/103 |
| 6,772,274 B1 * | 8/2004 | Estakhri .................... 711/103 |
| 2005/0160218 A1 * | 7/2005 | See et al. .................... 711/103 |
| 2007/0124533 A1 * | 5/2007 | Estakhri et al. ............. 711/103 |
| 2007/0143569 A1 * | 6/2007 | Sanders et al. .............. 711/203 |
| 2008/0082735 A1 * | 4/2008 | Shiga ........................ 711/103 |

* cited by examiner

Data structure of PLTPPUI in Reserved Area of MLC Flash Memory 420

Old physical block (PBK#1000) for storing PLTPPUI0 422

| | | | | |
|---|---|---|---|---|
| 1st Write (P0) 424a | Entry 0 | Entry 1 | ·· | FF | Special Logical Address for PLTPPUI0 |
| 2nd Write (P1) 424b | Entry 0 | Entry 1 | | | |
| ·· | | | | | |
| nth Write (Pn) 424n | Entry 0 | Entry 1 | ·· | | 1 |

New physical block (PBK#1012) for storing PLTPPUI0 432

| | | | | |
|---|---|---|---|---|
| (n+1)th Write (P0) 434 | Entry 0 | Entry 1 | ·· | FF | Special Logical Address for PLTPPUI0 | 2 |

*FIG. 4C*

Data Structure of the PLTPPUI Tracking Table 440

| | Physical Block Number 444 | Tracking No. (TN) 446 | Highest Page 448 |
|---|---|---|---|
| Special Logical Address for PLTPPUI0 | 1012 | 0 | 0 |
| Special Logical Address for PLTPPUI1 | 1018 | 5 | 1 |
| ... | | | |
| Special Logical Address for PLTPPUIN | 1005 | 4 | 0 |

Data Structure of the WL/BB Tracking Table 450

| | Physical Block Number 454 | Tracking No. (TN) 456 | Highest Page 458 |
|---|---|---|---|
| Special Logical Address for WL/BB0 | 1023 | 1 | 5 |
| Special Logical Address for WL/BB1 | 1020 | 0 | 3 |
| ⋮ | | | |
| Special Logical Address for WL/BBn | 1021 | 3 | 7 |

Data Structure of the WL/BB Tracking Table in Reserved Area of Flash Memory 460

| | | | | | 467 | 452 | 456 |
|---|---|---|---|---|---|---|---|
| 1st Write (P0) | BK0 (Reserved) | BK1 WL | | | F F | Special Logical Address for WL/BB1 | 1 |
| 2nd Write (P1) | | BK1 WL old | BK3 WL new | | | | |
| 3rd Write (P2) | | BK1 WL old | BK3 WL old | BK5 WL new | BK7 BB FFFF FFEE | | |
| ⋮ | | | | | | | |
| nth Write (Pn) | | | | | | | |

| 1st Write (P0) | BK1000 WL new | | | | F F | Special Logical Address for WL/BB2 | 1 |
|---|---|---|---|---|---|---|---|
| 2nd Write (P1) | BK1000 WL old | | BK1003 BB | BK1021 WL new | | | |
| ⋮ | | | | | | | |
| nth Write (Pn) | | | | | | | |

*FIG. 4F*

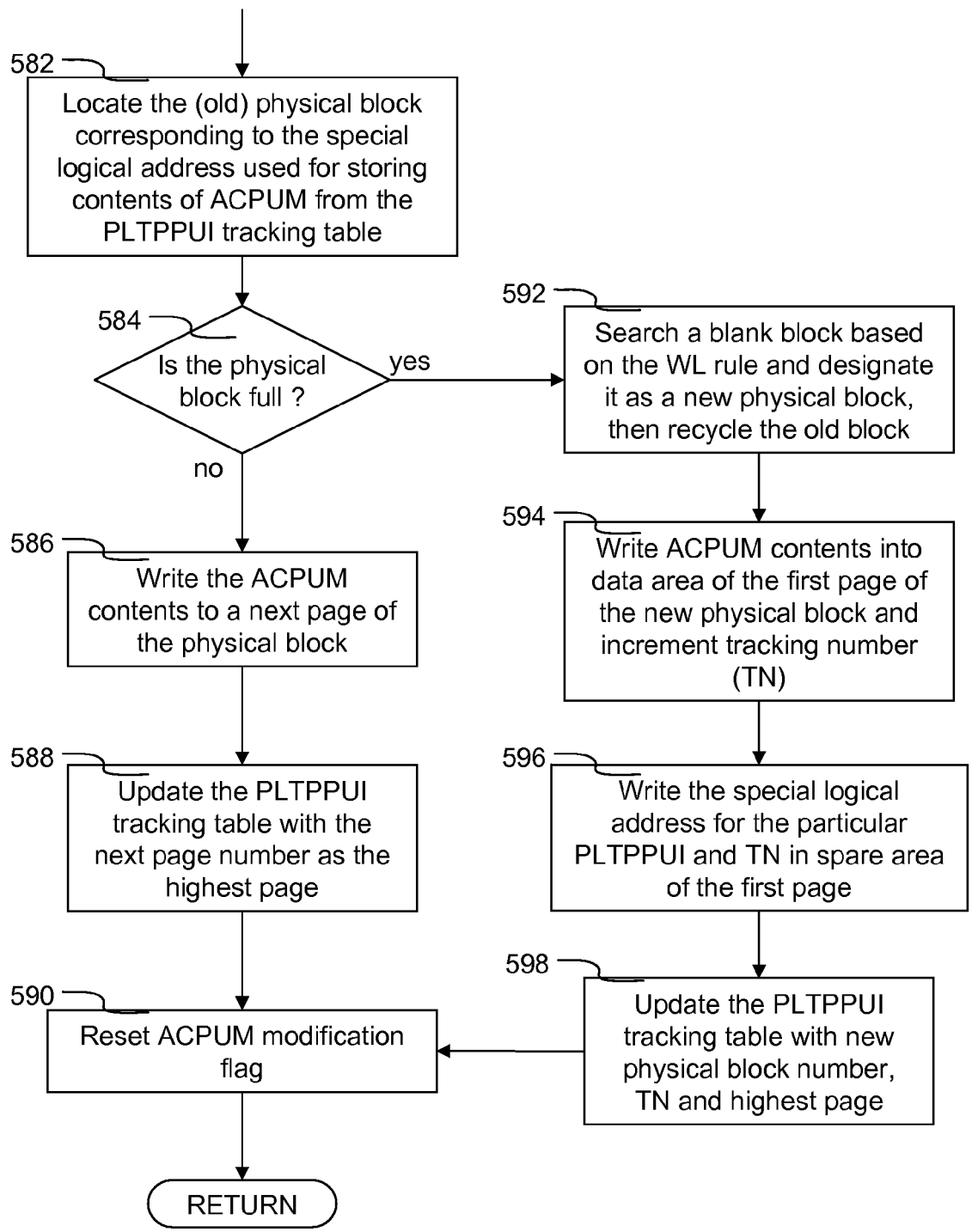

HIGH INTEGRATION OF INTELLIGENT NON-VOLATILE MEMORY DEVICE

CROSS-REFERENCE TO RELATED APPLICATIONS

This application is a continuation-in-part (CIP) of U.S. patent application for "High Endurance Non-Volatile Memory Devices", Ser. No. 12/035,398, filed Feb. 21, 2008, which is a CIP of "High Speed Controller for Phase Change Memory Peripheral Devices", U.S. application Ser. No. 11/770,642, filed on Jun. 28, 2007, which is a CIP of "Local Bank Write Buffers for Acceleration a Phase Change Memory", U.S. application Ser. No. 11/748,595, filed May 15, 2007, now U.S. Pat. No. 7,471,556 which is CIP of "Flash Memory System with a High Speed Flash Controller", application Ser. No. 10/818,653, filed Apr. 5, 2004, now U.S. Pat. No. 7,243,185.

This application is also a CIP of co-pending U.S. patent application for "Method and Systems of Managing Memory Addresses in a Large Capacity Multi-Level Cell (MLC) based Memory Device", Ser. No. 12/025,706, filed on Feb. 4, 2008, which is a CIP application for "Flash Module with Plane-interleaved Sequential Writes to Restricted-Write Flash Chips", Ser. No. 11/871,011, filed Oct. 11, 2007.

This application is also a CIP of U.S. patent application for "Manufacturing Method for Micro-SD Flash Memory Card", Ser. No. 11/966,871, filed on Jul. 18, 2008, which is a CIP for "Molding Methods to Manufacture Single-Chip Chip-on-Board USB Device", U.S. application Ser. No. 11/773,830, filed Jul. 5, 2007.

This application is also a CIP of U.S. patent application for "Single-Chip Multi-Media Card/Secure Digital controller Reading Power-on Boot Code from Integrated Flash Memory for User Storage", Ser. No. 11/309,594, filed on Aug. 28, 2006, now U.S. Pat. No. 7,383,362 which is a CIP of U.S. patent application for "Single-Chip USB Controller Reading Power-On Boot Code from Integrated Flash Memory for User Storage", Ser. No. 10/707,277, filed on Dec. 2, 2003, now issued as U.S. Pat. No. 7,103,684.

This application is also a CIP of U.S. patent application Ser. No. 11/624,667 filed on Jan. 18, 2007, now abandoned entitled "Electronic data Storage Medium with Fingerprint Verification Capability", which is a divisional patent application of U.S. patent application Ser. No. 09/478,720 filed on Jan. 6, 2000, now U.S. Pat. No. 7,257,714 issued on Aug. 14, 2007, all of which are incorporated herein as though set forth in full.

FIELD OF THE INVENTION

The present invention relates to non-volatile memory devices, and more particularly to high integration of intelligent non-volatile memory device (NVMD).

BACKGROUND OF THE INVENTION

Non-volatile memory (NVM) such as NAND flash, NOR flash, phase-change memory (PCM) has become popular as storage devices have been designed to use them. One of the important properties is that NVM can hold data stored thereon without power similar to hard disk drive.

Advantages of using non-volatile memory as data storage over hard disk drive are as follows:
(1) No moving parts;
(2) No noise or vibration caused by the moving parts;
(3) Higher shock resistance;
(4) Faster startup (i.e., no need to wait for spin-up to steady state);
(5) Faster random access;
(6) Faster boot and application launch time; and
(7) Lower read and write latency (i.e., seek time).

However, NVM has other drawings and shortcomings, for example, the NVM may only be written a limited number of times. Different NVM has different characteristics such as sector addressable for the flash or byte addressable for PCM; different programming rules for Multi-level cell (MLC) flash memory and Single-level cell (SLC) flash memory.

Moreover, NVM needs a controller such that the management and control of the NVM can be conducted without a host computer system. Today, the NVM controller and the NVM modules are generally manufactured separately. Therefore it would be desirable to a NVM controller can be configured to control different types of NVM. And it is further desired to have a NVM controller integrated with the NVM modules in a non-volatile memory device.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

High integration of a non-volatile memory device (NVMD) is disclosed. According to one aspect of the present invention, a non-volatile memory device comprises an intelligent non-volatile memory (NVM) controller and an intelligent non-volatile memory module. The NVM controller includes a central processing unit (CPU) configured to handle data transfer operations to the NVM module to ensure source synchronous interface, interleaved data operations and block abstracted addressing.

The intelligent NVM module includes an interface logic, a block address manager and at least one non-volatile memory array. The interface logic is configured to handle physical block management. The block address manager is configured to ensure a physical address is converted to a transformed address that is accessible to the CPU of the intelligent NVM controller. The transformed address may be an address in blocks, pages, sectors or bytes either logically or physically.

According to another aspect, a single-chip NVMD all of the components in the intelligent NVM controller and the intelligent NVM module. The single-chip may include stacked MLC dies connected together with a thin film tape mounted on a substrate (e.g., printed circuit board).

According to another aspect, an intelligent NVMD includes the functionalities of managing memory addresses in large capacity of MLC flash memory. According to yet another aspect, phase-change random access memory may be used instead of flash memory. NOR flash may also be used instead of NAND flash memory.

According to one embodiment of the present invention, a single-chip non-volatile memory device (NVMD) comprises at least the following: a high-speed internal bus with a plurality of components coupled thereupon; the components includes: an external interface configured to perform data transfer operations in accordance with one of industry standards; a central processing unit (CPU) configured to manage data transfer operations between a host computer system and the single-chip NVMD; at least one non-volatile memory (NVM), each including a page register configured to conduct data exchanges with a plurality of parallel data buffers, wherein N sets of partial logical-to-physical address and page usage information (PLTPPUI) are stored in reserved area of the at least one NVM, N is a positive integer, wherein each of the data changes is managed by the CPU through source synchronous interface, data interleaving and abstracted addressing; a block address manager configured to ensure a physical address of the at least one NVM is converted to a transformed address accessible to the CPU; and an address correlation and page usage memory (ACPUM) configured to hold one of the N sets of PLTPPUI such that said one set pertinent to a particular one of the data exchanges between the NVM controller and the at least one NVM.

The single-chip NVMD further comprises an error correction code module coupling to the internal bus configured for creating, detecting and correcting data errors in data exchanges between the plurality of data buffers and the page register of the NVM and a wear leveling logic coupling the internal bus configured to ensure even usage of the at least one NVM.

According to another embodiment, a non-volatile memory device comprises at least the following: an intelligent NVM controller including an external interface, a central processing unit (CPU), an address correlation and page usage memory (ACPUM), a plurality of parallel data buffers, the external interface is configured to perform data transfer operations in accordance with one of industry standards, the CPU is configured to manage data transfer operations between a host computer system and the NVM device; and an intelligent NVM module coupling to and controlled by the intelligent NVM controller, the intelligent NVM module includes at least one non-volatile memory (NVM), an interface logic and a block address manager, each of the at least one NVM includes a page register configured to conduct data exchanges with the plurality of parallel data buffers, wherein the block address manager is configured to ensure a physical address of the at least one NVM is converted to a transformed address accessible to the intelligent NVM controller, and wherein N sets of partial logical-to-physical address and page usage information (PLTPPUI) are stored in reserved area of the at least one NVM, N is a positive integer; wherein the ACPUM is configured to hold one of the N sets of PLTPPUI such that said one set pertinent to a particular one of the data exchanges between the NVM controller and the at least one NVM.

One of the objects, features, and advantages in the present invention is that a single chip NVMD allows an embedded NVM controller to control and manage the NVM modules integrated therein high efficiency. Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIGS. 4A-4F collectively show exemplary data structures used for managing memory addresses of the flash memory of FIG. 2A in accordance with one embodiment of the present invention;

FIGS. 5A-5E collectively show a flow chart of an exemplary process of conducting data transfer requests of the flash memory of FIG. 2A in accordance with one embodiment of the present invention;

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Used herein, the terms "upper", "lower", "top", "bottom", "front", "back", "rear", "side", "middle", "upwards", and "downwards" are intended to provide relative positions for the purposes of description, and are not intended to designate an absolute frame of reference. Further, the order of blocks in process flowcharts or diagrams representing one or more embodiments of the invention do not inherently indicate any particular order nor imply any limitations in the invention.

Embodiments of the present invention are discussed herein with reference to FIGS. 1-9. However, those skilled in the art will readily appreciate that the detailed description given herein with respect to these figures is for explanatory purposes as the invention extends beyond these limited embodiments.

Figure 1A:
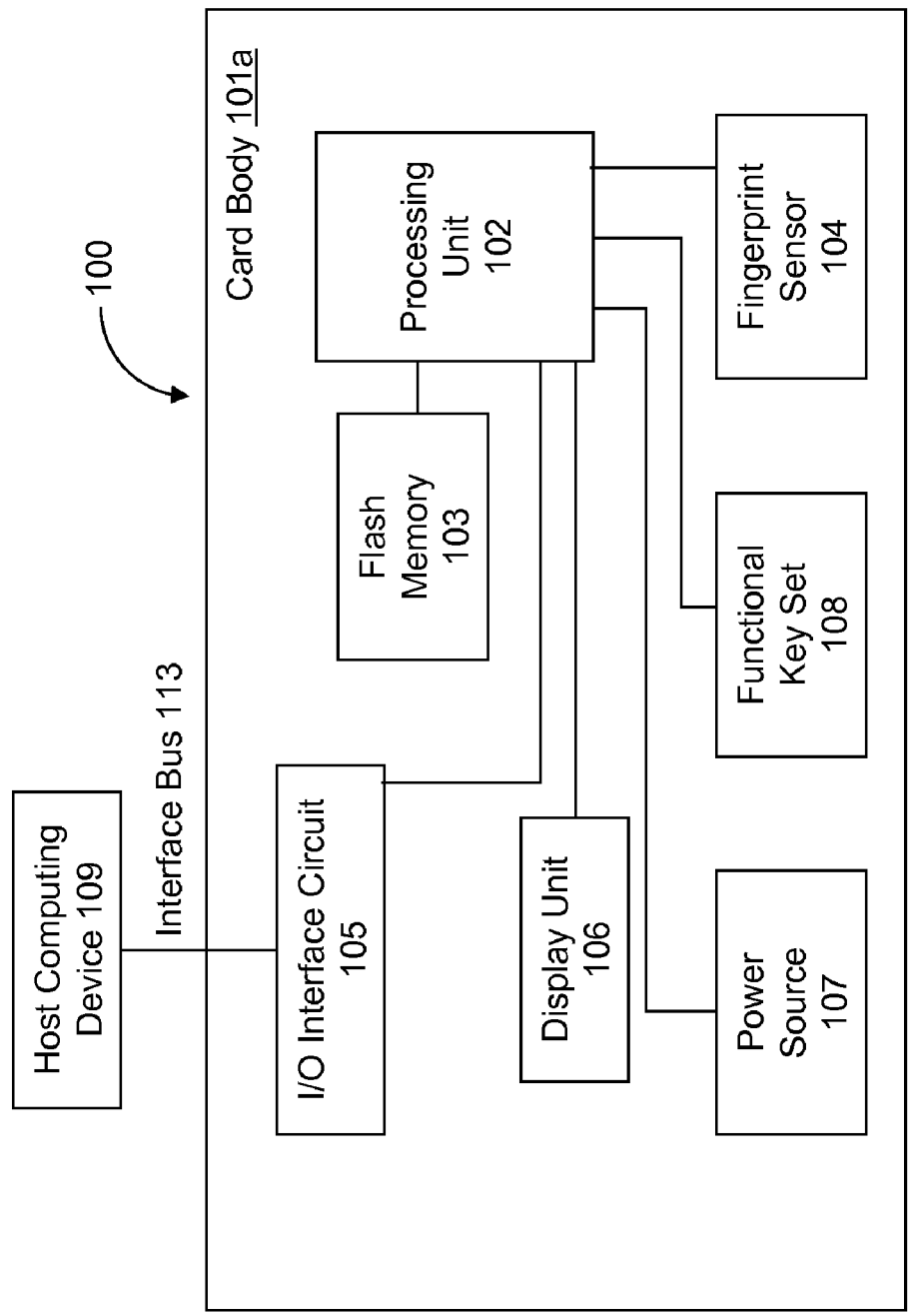
FIGS. 1A-1D are block diagrams illustrating exemplary flash memory devices in accordance with four embodiments of the present invention.

FIGS. 1A-1D are block diagrams illustrating exemplary flash memory devices in accordance with four embodiments of the present invention. Shown in FIG. 1A is a first electronic environment. First flash memory device 100 is adapted to be accessed by a host computing device 109 via an interface bus 113. The first flash memory device 100 includes a card body 101a, a processing unit 102, at least one flash memory module 103, a fingerprint sensor 104, an input/output (I/O) interface circuit 105, an optional display unit 106, an optional power source (e.g., battery) 107, and an optional function key set 108. The host computing device 109 may include, but not be limited to, a desktop computer, a laptop computer, a mother board of a personal computer, a cellular phone, a digital camera, a digital camcorder, a personal multimedia player.

The card body 101a is configured for providing electrical and mechanical connection for the processing unit 102, the flash memory module 103, the I/O interface circuit 105, and all of the optional components. The card body 101a may comprise a printed circuit board (PCB) or an equivalent substrate such that all of the components as integrated circuits may be mounted thereon. The substrate may be manufactured using surface mount technology (SMT) or chip on board (COB) technology.

The processing unit 102 and the I/O interface circuit 105 are collectively configured to provide various control functions (e.g., data read, write and erase transactions) of the flash memory module 103. The processing unit 102 may also be a standalone microprocessor or microcontroller, for example, an 8051, 8052, or 80286 Intel® microprocessor, or ARM®, MIPS® or other equivalent digital signal processor. The processing unit 102 and the I/O interface circuit 105 may be made in a single integrated circuit, for application specific integrated circuit (ASIC).

The at least one flash memory module 103 may comprise one or more flash memory chips or integrated circuits. The flash memory chips may be single-level cell (SLC) or multi-level cell (MLC) based. In SLC flash memory, each cell holds one bit of information, while more than one bit (e.g., 2, 4 or more bits) are stored in a MLC flash memory cell. A detail data structure of an exemplary flash memory is described and shown in FIG. 2A and corresponding descriptions thereof.

The fingerprint sensor 104 is mounted on the card body 101a, and is adapted to scan a fingerprint of a user of the first electronic flash memory device 100 to generate fingerprint scan data. Details of the fingerprint sensor 104 are shown and described in a co-inventor's U.S. Pat. No. 7,257,714, entitled "Electronic Data Storage Medium with Fingerprint Verification Capability" issued on Aug. 14, 2007, the entire content of which is incorporated herein by reference.

The flash memory module 103 stores, in a known manner therein, one or more data files, a reference password, and the fingerprint reference data obtained by scanning a fingerprint of one or more authorized users of the first flash memory device. Only authorized users can access the stored data files. The data file can be a picture file, a text file or any other file. Since the electronic data storage compares fingerprint scan data obtained by scanning a fingerprint of a user of the device with the fingerprint reference data in the memory device to verify if the user is the assigned user, the electronic data storage can only be used by the assigned user so as to reduce the risks involved when the electronic data storage is stolen or misplaced.

The input/output interface circuit 105 is mounted on the card body 101a, and can be activated so as to establish communication with the host computing device 109 by way of an appropriate socket via an interface bus 113. The input/output interface circuit 105 may include circuits and control logic associated with a Universal Serial Bus (USB) interface structure that is connectable to an associated socket connected to or mounted on the host computing device 109. The input/output interface circuit 105 may also be other interfaces including, but not limited to, Secure Digital (SD) interface circuit, Micro SD interface circuit, Multi-Media Card (MMC) interface circuit, Compact Flash (CF) interface circuit, Memory Stick (MS) interface circuit, PCI-Express interface circuit, a Integrated Drive Electronics (IDE) interface circuit, Serial Advanced Technology Attachment (SATA) interface circuit, external SATA, Radio Frequency Identification (RFID) interface circuit, fiber channel interface circuit, optical connection interface circuit.

The processing unit 102 is controlled by a software program module (e.g., a firmware (FW)), which may be stored partially in a ROM (not shown) such that processing unit 102 is operable selectively in: (1) a data programming or write mode, where the processing unit 102 activates the input/output interface circuit 105 to receive data from the host computing device 109 and/or the fingerprint reference data from fingerprint sensor 104 under the control of the host computing device 109, and store the data and/or the fingerprint reference data in the flash memory module 103; (2) a data retrieving or read mode, where the processing unit 102 activates the input/output interface circuit 105 to transmit data stored in the flash memory module 103 to the host computing device 109; or (3) a data resetting or erasing mode, where data in stale data blocks are erased or reset from the flash memory module 103. In operation, host computing device 109 sends write and read data transfer requests to the first flash memory device 100 via the interface bus 113, then the input/output interface circuit 105 to the processing unit 102, which in turn utilizes a flash memory controller (not shown or embedded in the processing unit) to read from or write to the associated at least one flash memory module 103. In one embodiment, for further security protection, the processing unit 102 automatically initiates an operation of the data resetting mode upon detecting a predefined time period has elapsed since the last authorized access of the data stored in the flash memory module 103.

The optional power source 107 is mounted on the card body 101a, and is connected to the processing unit 102 and other associated units on card body 101a for supplying electrical power (to all card functions) thereto. The optional function key set 108, which is also mounted on the card body 101a, is connected to the processing unit 102, and is operable so as to initiate operation of processing unit 102 in a selected one of the programming, data retrieving and data resetting modes. The function key set 108 may be operable to provide an input password to the processing unit 102. The processing unit 102 compares the input password with the reference password stored in the flash memory module 103, and initiates authorized operation of the first flash memory device 100 upon verifying that the input password corresponds with the reference password. The optional display unit 106 is mounted on the card body 101a, and is connected to and controlled by the processing unit 102 for displaying data exchanged with the host computing device 109.

Figure 1B:
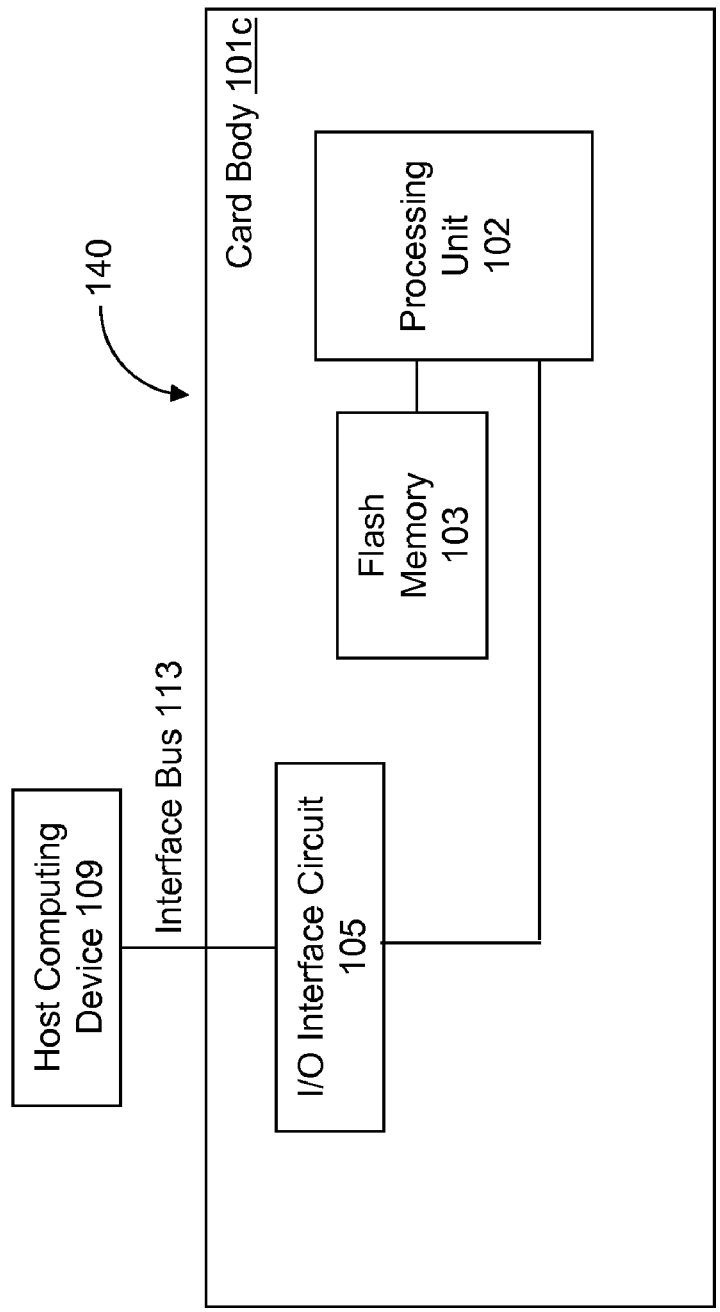

Shown in FIG. 1B, second electronic flash memory device 140 includes a card body 101c with a processing unit 102, an I/O interface circuit 105 and at least one flash memory module 103 mounted thereon. Similar to the first flash memory device, the second flash memory device 140 couples to a host computing device 109 via an interface bus 113. Fingerprint functions such as scanning and verification are handled by the host computing device 109.

Figure 1C:
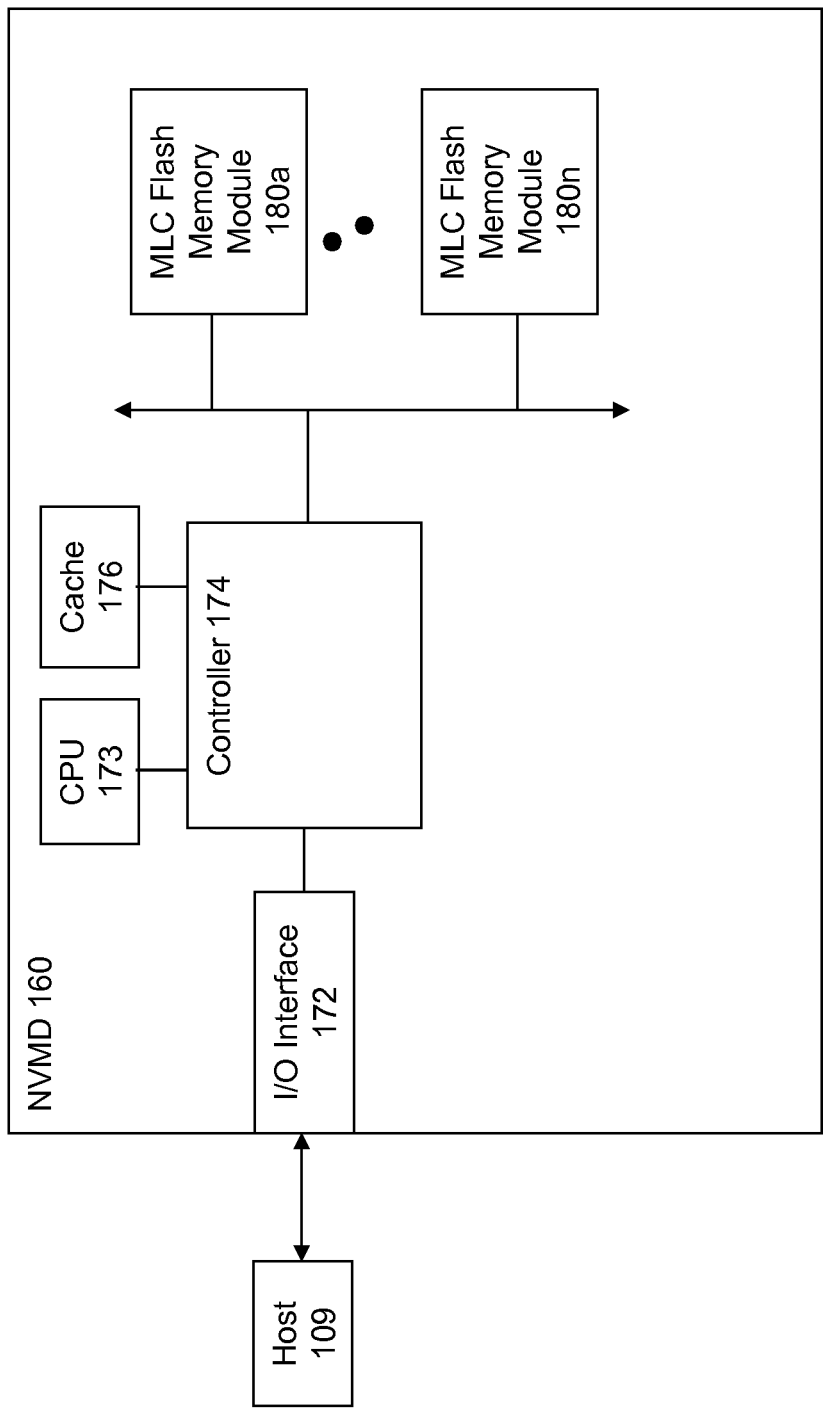

According another embodiment, a third flash memory device 160 is shown in FIG. 1C. The third flash memory device 160 comprises at least one microprocessor or central processing unit (CPU) 173, an input/output (I/O) controller 172, a flash memory controller 174, a data cache subsystem 176 and at least one MLC flash memory module 180a-n.

When the third flash memory device 160 is adapted to the host computer system 109, the I/O interface 172 is operable to ensure that data transfer between the host 109 and the at least one MLC flash memory module 180a-n through one of the industry standards. The CPU 173 comprises a general purpose processing unit (e.g., a standalone chip or a processor core embedded in a system on computer (SoC)) configured for executing instructions loaded on the main storage (e.g., main memory (not shown)). The flash memory controller 174 is configured to manage data transfer operations between the host computer system 109 and the at least one MLC flash memory module 180a-n. Types of the data transfer operations include data reading, writing (also known as programming) and erasing. The data transfer operations are initiated by the host 109. Each of the data transfer operations is accomplished with a logical address (e.g., logical sector address (LSA)) from the host 109 without any knowledge of the physical characteristics of the fish memory device 160.

The data cache subsystem 176 comprises of volatile memory such as random access memory (e.g., dynamic random access memory (DRAM)) coupled to the CPU 173 and the flash memory controller 174. The cache subsystem 176 is configured to hold or cache either incoming or outgoing data in data transfer operations to reduce number of data writing/programming operations directly to the at least one MLC flash memory module 180a-n. The cache subsystem 176 includes one or more levels of cache (e.g., level one (L1) cache, level two (L2) cache, level three (L3) cache, etc.). The cache subsystem 176 may use one of the mapping schemes including direct mapping, fully associative and Multi-set (Multi-way) associative. According to one aspect, the cache subsystem 176 is configured to cover the entire range of logical address, which is mapped to physical address of the at least one MLC flash memory module 180a-n.

Each of the at least one MLC flash memory module 180a-n may include at least one MLC flash memory chip (i.e., integrated circuit). Each chip includes one or more planes of flash cells or arrays. Each plane comprises an independent page register configured to accommodate parallel data transfer operations. Each plane of the non-volatile memory chip is arranged in a data structure as follows: Each of the chips is divided into a plurality of data blocks and each block is then partitioned into a plurality of data pages. Each of the pages may contain one or more addressable data sectors in a data area and other information such as error correcting code (ECC) in a spare area. The data erasing in the non-volatile memory is perform in a data block by data block basis, while the data reading and writing can be performed for each data sector. The data register is generally configured to hold one data page including both data and spare areas. Although MLC flash memory modules 180a-n have been shown and described herein, other types of the non-volatile memory (NVM) may be substituted to accomplish the same. Other NVMs include, but not be limited to, SLC flash memory (SLC), phase-change random access memory, Magnetoresistive random access memory, Ferroelectric random access memory, Nano random access memory.

Figure 1D:
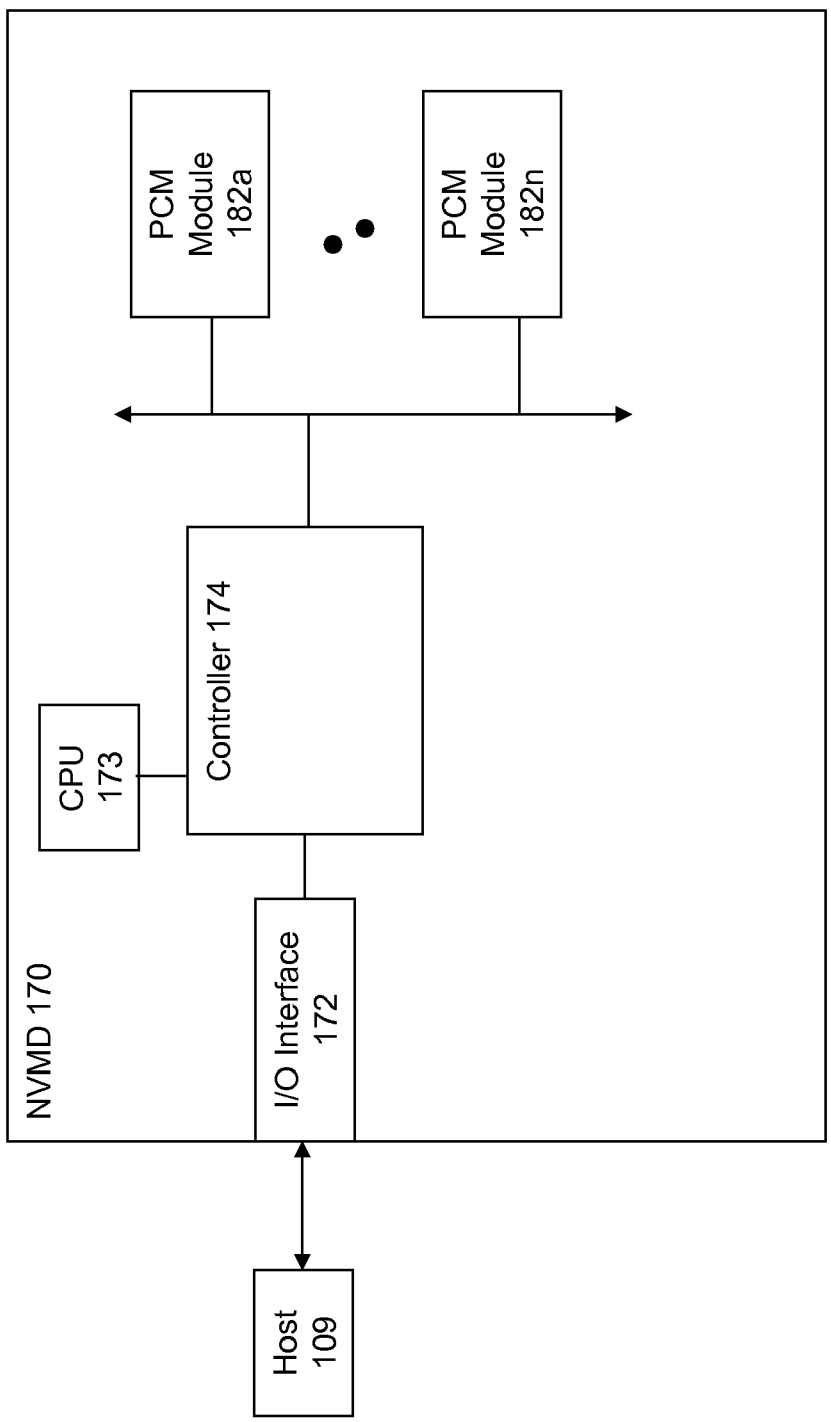

FIG. 1D shows a fourth exemplary NVMD 170 according to yet another embodiment of the present invention. The fourth NVMD 170 is similar to the third NVMD 160, except using phase-change random access memory (PCM) modules 182a-n to replace the MLC 180a-n. In addition, there is no data cache subsystem in the fourth NVMD 170.

Figure 2A:
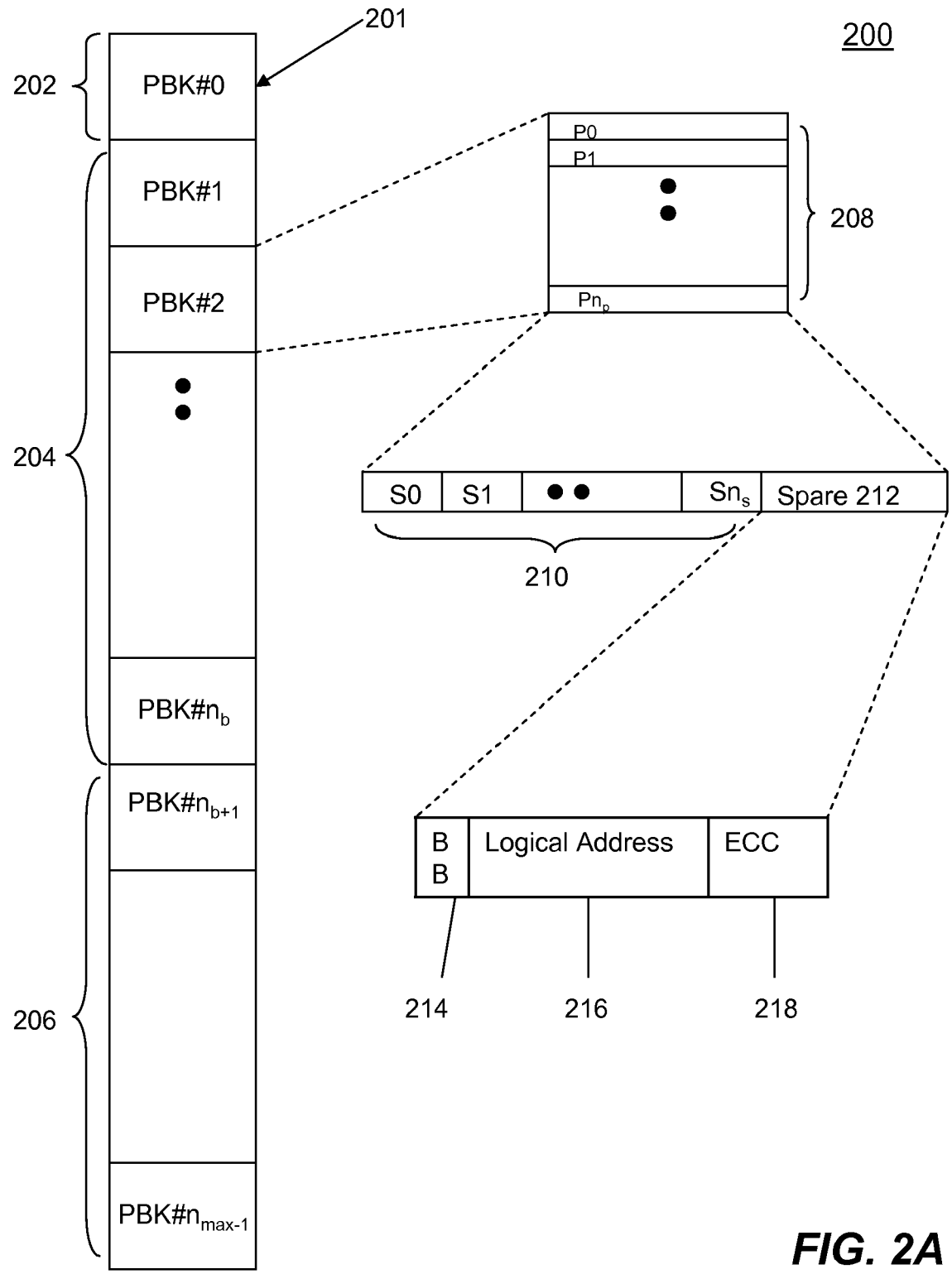
FIG. 2A is a diagram depicting a data structure of an exemplary large capacity flash memory, according one embodiment of the present invention.

Referring now to FIG. 2A, which is a diagram depicting an exemplary data structure 200 of a flash memory module 201 (e.g., flash memory module 103 of FIG. 1B) in accordance with one embodiment of the present invention. The flash memory module 201 is divided into a plurality of physical blocks e.g., PBK #0, PBK #1, PBK #2, . . . ). In general, there are three categories of physical blocks: 1) the first block 202 (i.e., PBK #0); 2) normal usage data blocks 204 (i.e., PBK #1, PBK #2, . . . , PBK #$n_b$); and 3) reserved blocks 206 (i.e., PBK #$n_{b+1}$, . . . PBK #$n_{max-1}$). The first block (PBK#0) 202 is guaranteed to be a good block and used by the manufacturer to store certain information such as Flash Timing Parameter (FTP), and other information by Initial Manufacturing Program (IMP), which cannot be alter by users. The manufacturer may define a percentage (e.g., 95%) of the total capacity as normal usage data blocks and the rest as reserved. The normal usage data blocks 204 are configured for user to store user data, although the first block (i.e., PBK #1) of the normal usage data blocks 204 is generally used for storing Master Boot Record (MBR), which contains critical data for operation of a computing device. Lastly, the reserved blocks 206 are configured to be accessed by a program module (e.g., FW) via special memory addresses in accordance with one embodiment of the present invention. Examples of the special memory address are 0xFFFF0000, 0xFFFF0001, 0xFFFFFF00, 0xFFFFFF01, etc.

Each block is further divided into a plurality of pages 208 (e.g., P0, P1, . . . , Pn$_p$). Each of the pages 208 includes a data area 210 and a spare area 212. The data area is partitioned into a plurality of sectors (e.g., S0, S1, . . . , Sn$_s$). In one embodiment, each sector stores 512-byte of data. The spare area 212 is configured to provide three different fields: 1) a block indicator (BB) 214, a logical address area 216 and an error correction code (ECC) area 218. When a block is tested no good by the manufacturer, the block indicator 214 of that block is set to a special code to indicate a bad block that cannot be used. The logical address area 216 is configured for identifying of that particular physical block for initialization of the NVMD. More details are described in FIG. 4E and FIG. 4F for the reserved physical blocks as used by an embodiment of the present invention. The ECC area 218 is configured to store the ECC for ensuring data integrity.

In order to access the data stored in the normal usage blocks 204 of the flash memory module 201, the host computing device 109 transmits a data transaction request (e.g., data read or write) along with a logical sector address (LSA) to the NVMD (e.g., flash memory device 140 of FIG. 1B). The processing unit 102 of the NVMD converts the received LSA into a physical address (i.e., specific block, page and sector numbers) before any data transaction can be performed. Traditionally, the conversion is performed by an address look up table with a one-to-one relationship to the physical address. This solution works for a NVMD with relatively small capacity, because the address look up table is implemented with a static random access memory (SRAM). It would not be feasible in terms of cost and physical space to include SRAM that grows linearly as the capacity of the NVMD especially for a large capacity MLC based flash memory device. For example, a large capacity (say 32 Giga-Byte (GB)) MLC based flash memory device using 2112-byte page (i.e., 2048-byte data plus 64-byte spare) or a 4200-byte page (i.e., 4096-byte page with 104-byte spare) and 128 pages per block, it would require more than 2 MB bytes of SRAM to hold the entire address look up table.

Figure 2B:
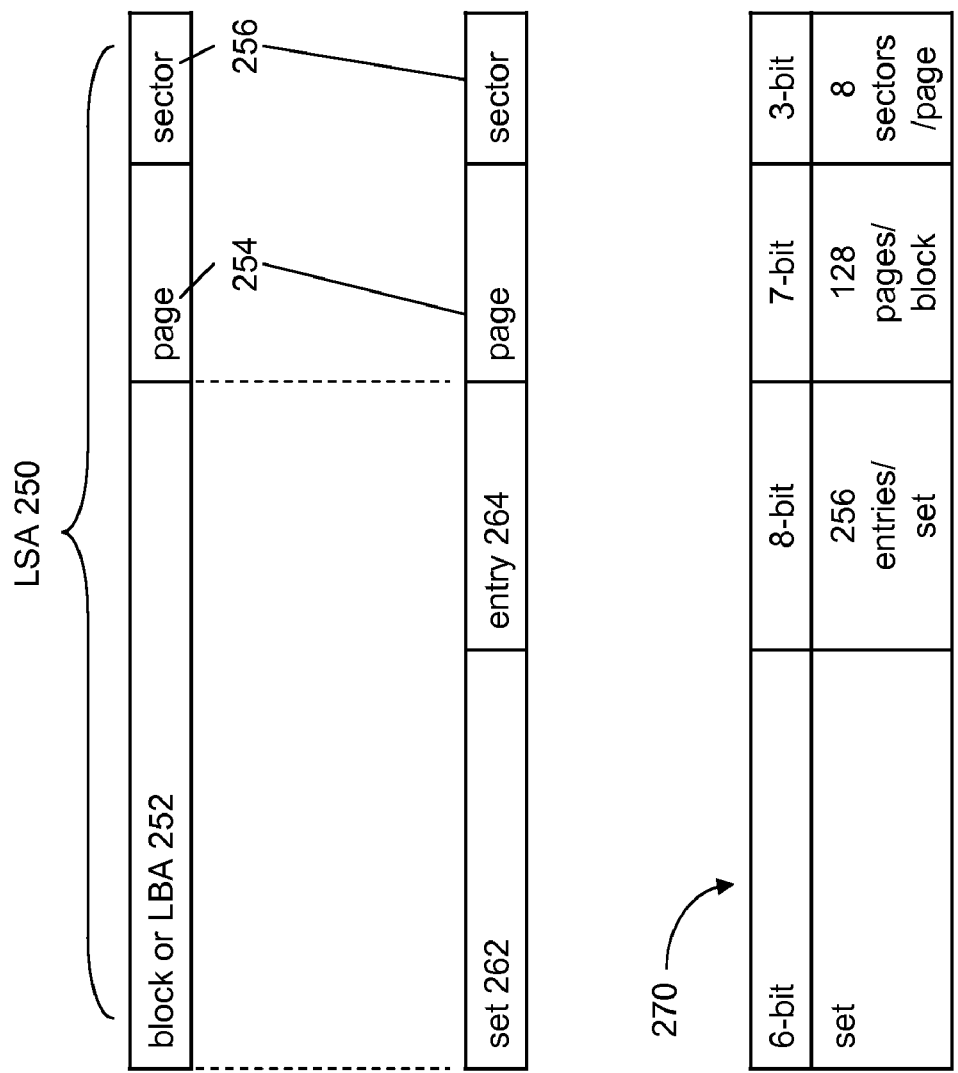
FIG. 2B is a diagram showing an exemplary scheme for partitioning a logical sector address in accordance with one embodiment of the present invention.

FIG. 2B is a diagram showing an exemplary scheme for partitioning a logical sector address in accordance with one embodiment of the present invention. A logical sector address (LSA) 250 is traditionally partitioned as three parts: block 252, page 254 and sector 256. The block portion 252 is also referred to as logical block address (LBA). According to one aspect of the present invention, the LSA 250 is partitioned into four parts: set 262, entry 264, page 254 and sector 256. The page 254 and sector 256 remain the same. And the block 252 is further partitioned into two parts: the set 262 and the entry 264. In other words, instead of just using block 252 as basic unit, the blocks are divided into a plurality of sets 262. Each of the sets 262 includes a plurality of entries 264. For example, if a 24-bit LSA 270 is partitioned in the following manner: 6-bit for set, 8-bit for entry, 8-bit for page and 3-bit for sector, the LSA 270 could represent up to 64 sets of 256 entries (i.e., 16,384 blocks) with each block containing 128 pages and each page containing 8 sectors of 512-byte of data. In this document, the number of the plurality of sets is N, where N is a positive integer.

To carry out the address partition scheme of the present invention, the manufacturer may predefine number of sets and entries in the first physical block (i.e., PBK #0) by the IMP. Instead of mapping all of the logical sector addresses (LSA) to a physical address in a memory, only a portion of the LSA (i.e., a set) is included such that only a limited size of memory is required for address correlation and page usage information. In other words, a limited size memory is configured to hold one set of entries with each entry including an address of the corresponding physical block and a plurality of corresponding page usage flags (see FIG. 4A for details). For example, 18-byte (i.e., 2-byte for the physical block address plus 128-bit or 16-byte for 128 page usage flags) is required for each entry, hence a total of 4608-byte of memory is required for a set with 256 entries.

However, in order to correlate a logical block address to a unique physical block, every entry in each of the plurality of sets must correlate to a unique physical address and a set of page usage flags. Since the limited size memory only has capacity of holding one set of such information, an embodiment of the present invention requires that information of all of the plurality of sets be stored in reserved area 206 of the flash memory 201. Only a relevant set of the plurality of sets is loaded into the limited size memory in response to a particular data transfer request from a host computing system 109. The relevant set is defined as the set with one of the entries matches the entry number derived from the LSA associated with the received data transfer request.

Since there are N sets of address correlation and page usage information stored in the flash memory, each of the N sets is referred to as a partial logical-to-physical address and page usage information (hereinafter 'PLTPPUI') appended with a set number (e.g., 'PLTPPUI0', 'PLTPPUI1', ... 'PLTP-PUIN').

In order to simplify the examples and drawings in the Specification, an example with small numbers is used for demonstrate the relationship between LSA, LBA, sector, page, entry and set numbers. Those of ordinary skill in the art will understand implementation of an embodiment of the present invention can be with larger numbers. The following example uses a flash memory with four sectors per page, four pages per block and four entries per set and a logical sector address 159 (i.e., LSA=159) is represented by a binary number "10 01 11 11". As a result, the least significant four bits of LSA represent sector and page numbers with the two lowest bits for the sector number and the next two for the page number, as each two-bit represents four distinct choices—0, 1, 2 and 3. After truncating the four least significant bits of LSA, the remaining address becomes the corresponding logical block address (LBA). In this example, LBA has a binary value of '1001'. Because there are four entries per set in this example, two least significant bits of LBA represent the entry number (i.e., offset number in each set). The remaining high bits of LBA represent the set number. A summary of this example is listed in Table 1.

TABLE 1

| 10 | 01 | 11 | 11 |
|---|---|---|---|
| Set Number | Entry Number | Page Number | Sector Number |

According to one aspect of the present invention, an indexing scheme enables the processing unit 102 to translate logical sector addresses (LSAs) and/or logical block addresses (LBAs) provided, in conjunction with a data transfer request, by the host computing device 109 to physical block numbers or addresses (PBK #) in the flash memory device 140. The indexing scheme comprises a plurality of sets of PLTPPUI and physical characteristics of the flash memory such as total number of sets, entries, pages and sectors. And ratios among the set, entry, page and sector. The processing unit 102 can utilize the indexing scheme to determine which sectors of the flash memory are available for each particular data transfer request.

Figure 2C:
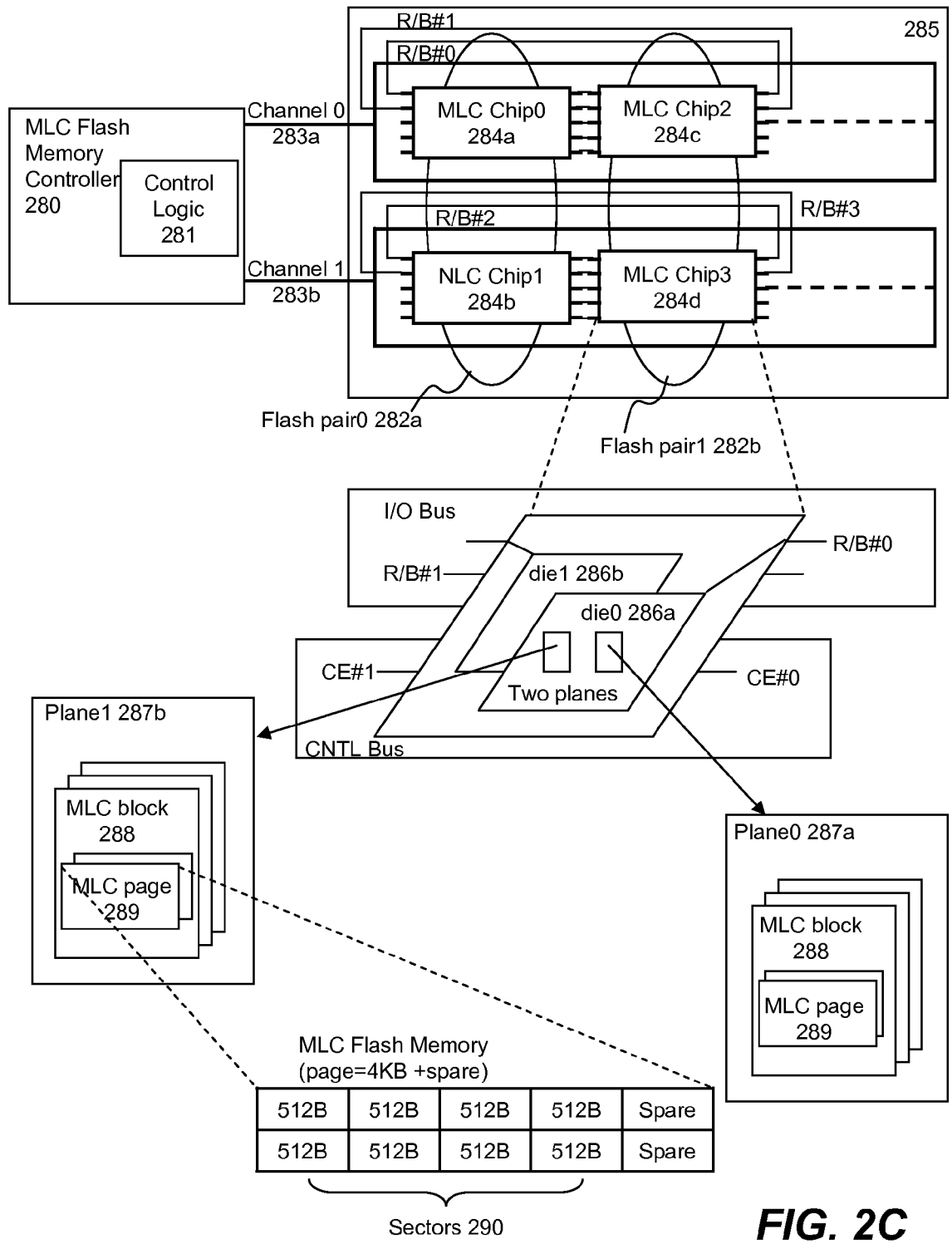
FIG. 2C is a diagram showing architecture of an exemplary MLC NVMD according to an embodiment of the present invention.

FIG. 2C is a diagram showing architecture of an exemplary MLC NVMD according to an embodiment of the present invention. The MLC based NVMD comprises a MLC flash memory controller 280 and an MLC flash memory module 285. A pair of parallel data channels (i.e., 'channel 0' 283a, 'channel 1' 283b) connects the MLC flash memory controller 280 and the MLC flash memory module 285. The MLC flash memory controller 280 comprises a control logic 281 configured to enable interleaved parallel data transfer operations via the parallel data channels 283a-b. The MLC flash memory module 285 comprises four MLC flash chips (i.e., 'Chip 0' 284a, 'Chip 1' 284b, 'Chip 2' 284c and 'Chip 3' 284d). The MLC flash chips are arranged in the two schemes. In one scheme, 'Chip 0' 284a and 'Chip 2' 284c are connected to 'channel 0' 283a while 'Chip 1' 284b and 'Chip 3' 284d connected to 'channel 1' 283b. In the other scheme, 'Chip 0'

284a and 'Chip 1' 284b are grouped to form 'flash pair 0' 282a and 'Chip 2' 284c and 'Chip 3' 284d form 'flash pair 1' 282b.

Each of the MLC flash chips 284a-d comprises two dies (i.e., 'die 0' 286a and 'die 1' 286b). Each of the dies includes two planes (i.e., 'plane 0' 287a and 'plane 1' 287b). Within each plane, MLC flash is partitioned as blocks 288, pages 289 and sectors 290 as explained in FIG. 2A.

Figure 3A:
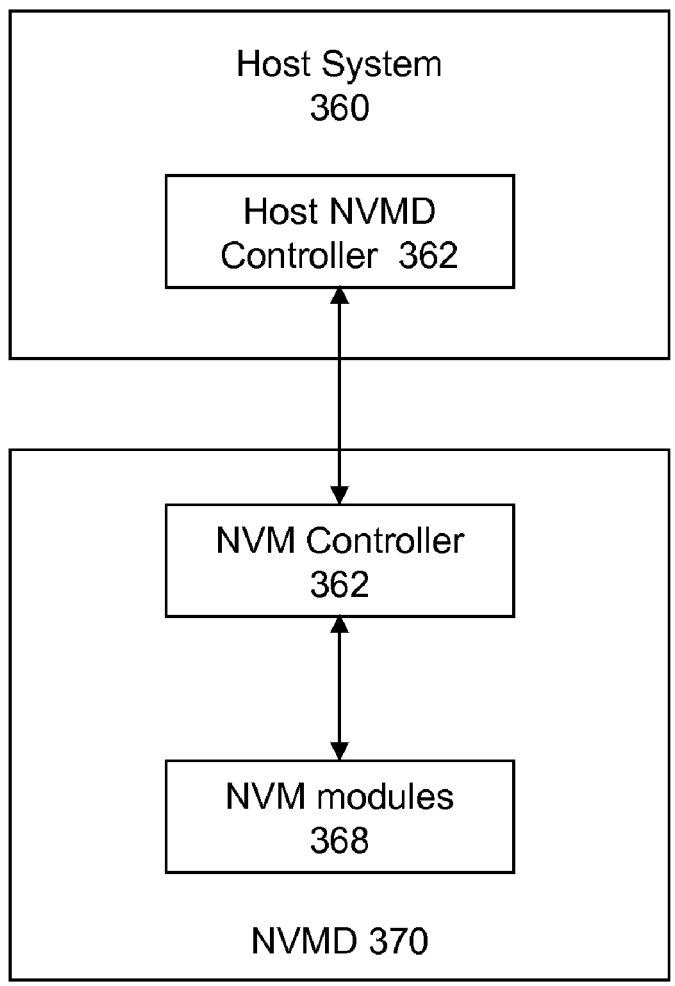
FIG. 3A is a diagram showing an environment in which one embodiment of the present invention may be implemented.

FIG. 3A is a diagram showing an environment in which one embodiment of the present invention may be implemented. The environment includes a host computer system 360 and a NVMD 370. The host computer system comprises a host NVMD controller 362, while the NVMD comprises a NVM controller 362 and at least one NVM modules 368. The host NVMD controller 362 is configured to communicate with the NVM controller 362 via an external bus based on one of the industry standards, for example USB, SD/MMC, SATA, PATA, IDE, etc.

Figure 3B:
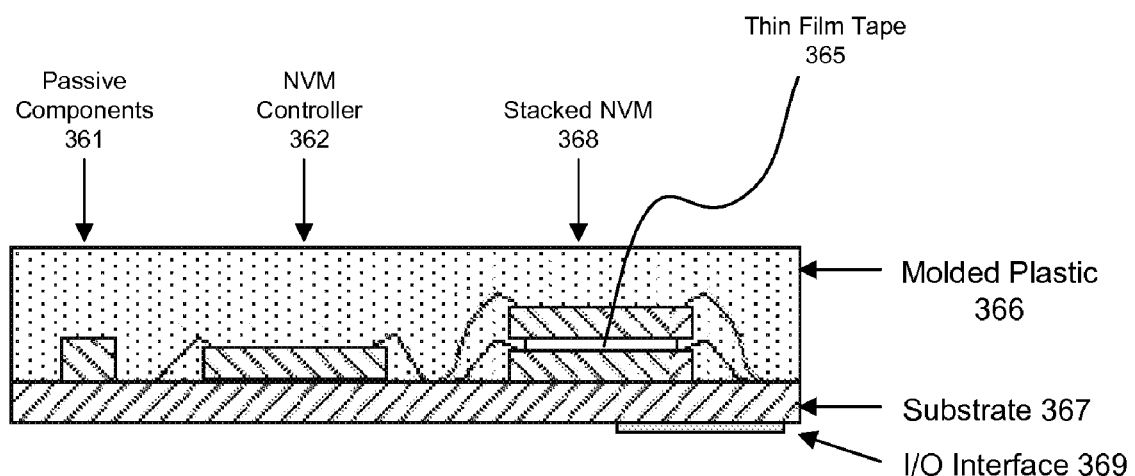
FIG. 3B is a cross-sectional view of an exemplary single-chip NVMD in accordance with one embodiment of the present invention.

FIG. 3B is a cross-sectional view of an exemplary single-chip NVMD in accordance with one embodiment of the present invention. The single-chip includes a substrate 367 with a plurality of components mounted thereon. The components include at least one passive component 361, a NVM controller 362, a plurality of NVM chips 368 and an input/output (I/O) interface 369. The passive components 361 include resistors, capacitors. The plurality of NVM 368 is stackedly adhered together with a thin film tape 365. The entire assembly is encased in a molded plastic 366. The I/O interface 369 is configured to communicate with the host computer system. Although single-chip NVMD is shown herein as a packaging version, single-chip NVMD may be manufactured as single piece of integrated circuit or chip or die.

Figure 3C:
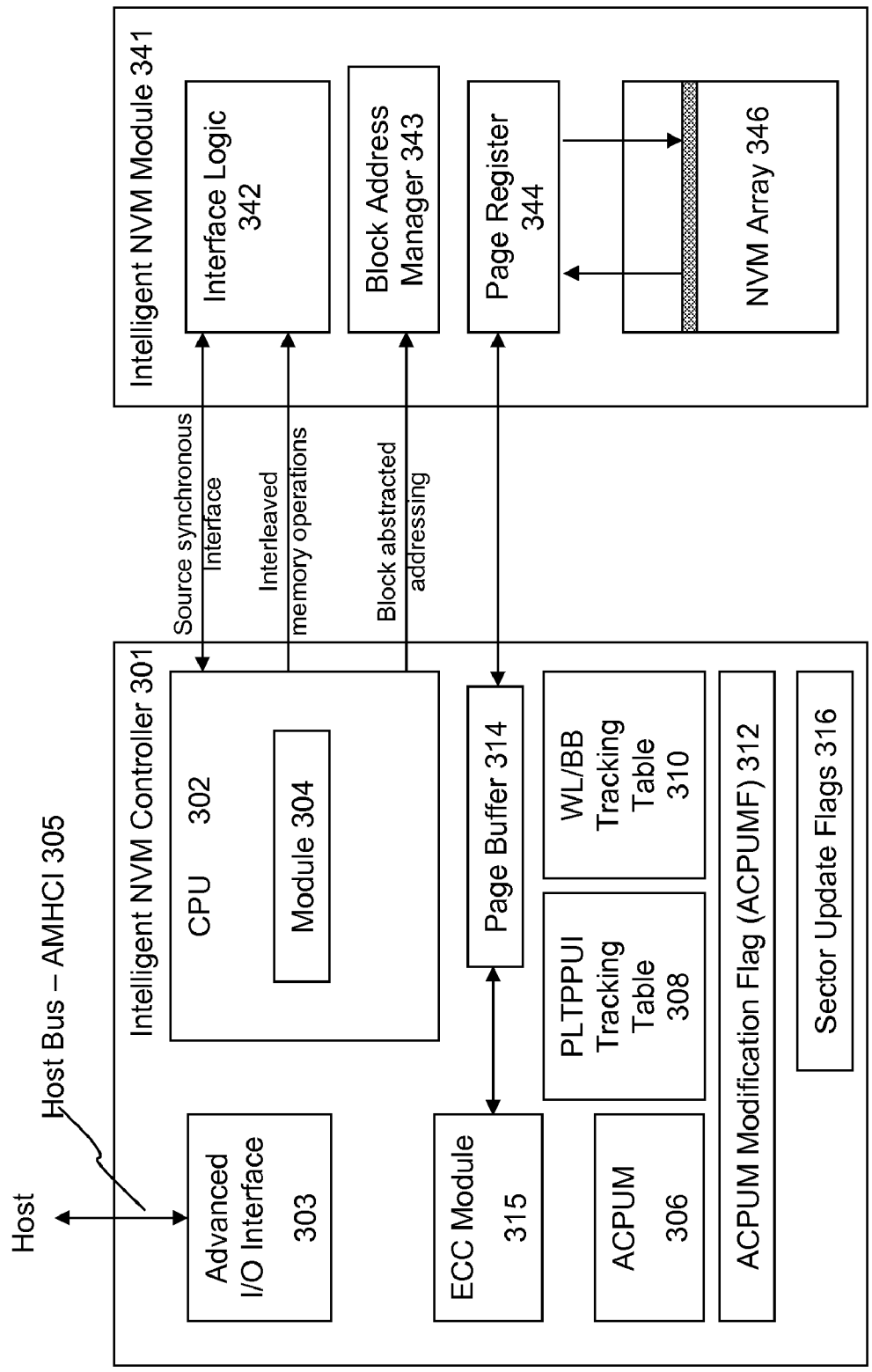
FIG. 3C is a functional block diagram illustrating salient components of an exemplary NVMD, which comprises an intelligent NVM controller and at least one NVM module, according to an embodiment of the present invention.

FIG. 3C is a simplified block diagram showing salient components of an exemplary non-volatile memory device (NVMD) in accordance with one embodiment of the present invention. The NVMD comprises an intelligent NVM controller 301 and an intelligent NVM module 341. The controller 301 comprises an advanced input/output (I/O) interface logic 303, a central processing unit (CPU) 302 (e.g., microcontroller, microprocessor), an address correlation and page usage memory (ACPUM) 306, a PLTPPUI tracking table 308, a wear leveling and bad block (WL/BB) tracking table 310, a ACPUM modification flag (ACPUMF) 312, a page buffer 314, an error correction code (ECC) module 315 and a set of sector update flags 316.

The advanced I/O interface logic 303 is configured to facilitate data, control signal and power communication with a host (e.g., a computer system, an electronic device, etc.) via a host bus 305 in accordance with Advanced Memory Host Control Interface (AMHCI). AMHCI enables communication of data, control signals and power management between the intelligent NVM controller 301 and the host. AMHCI comprises a protocol that works in conjunction with other current and future industry standards including for example, current and future versions of Universal-Serial Bus (USB), Secure Digital, Serial (SD), Micro SD, Multi-Media Card (MMC), Compact Flash (CF), Memory Stick (MS), PCI-Express, a Integrated Drive Electronics (IDE), Serial Advanced Technology Attachment (SATA), Parallel SATA, Radio Frequency Identification (RFID), fiber channel and optical connections, or other equivalent technological standards. The CPU 302 with a flash memory controlling program module 304 (e.g., firmware (FW)) installed thereon is configured to control the data transfer between the host computer system and the NVMD. The ACPUM 306 is configured to provide an address correlation table, which contains a plurality of entries, each represents a correlation between a partial logical block address (i.e., entries) to the corresponding physical block number. In addition, a set of page usage flags associated with the physical block is also included in each entry. The ACPUM 306 represents only one of the N sets of PLTPPUI, which is stored in the reserved area of the flash memory. In order to keep tracking the physical location (i.e., physical block number) of each of the N sets of PLTPPUI, the physical location is stored in the PLTPPUI tracking table 308. Each item is the PLTPPUI tracking table 308 corresponds a first special logical address to one of the N sets of PLTPPUI. The wear leveling counters and bad block indicator for each physical block is stored in a number of physical blocks referred by corresponding second special logical addresses (e.g., '0xFFFFFF00'). The WL/BB tracking table 310 is configured to store physical block numbers that are assigned or allocated for storing these physical block wear leveling counters and bad blocks. The ACPUM modification flag (ACPUMF) 312 is configured to hold an indicator bit that tracks whether the ACPUM 306 has been modified or not. The page buffer 314 is configured to hold data in a data transfer request. The page buffer 314 has a size equaling to the page size of the flash memory 201. The sector update flags 316 are configured to hold valid data flag for each of the corresponding sectors written into data area of the page buffer 314. For example, four sector update flags are be required for a page buffer comprising four sectors. The page buffer 314 also includes a spare area for holding other vital information such as error correction code (ECC) for ensuring data integrity of the flash memory. The ECC is generated by the ECC module 315.

The intelligent NVM module 341 comprises an interface logic 342, a block address manager 343 and at least one NVM array 346. The interface logic 342 is configured to physical memory management. The block address manager 343 is configured to ensure the physical address is converted to a transformed address that is accessible by the CPU 302. Each of the at least one NVM array 346 includes a page register 344, which corresponds to the page buffer 314 for data transfer operations. The CPU 302 is further configured to ensure data transfer operation through source synchronous interface, interleaved data operations and block abstracted addressing.

Figure 3D:
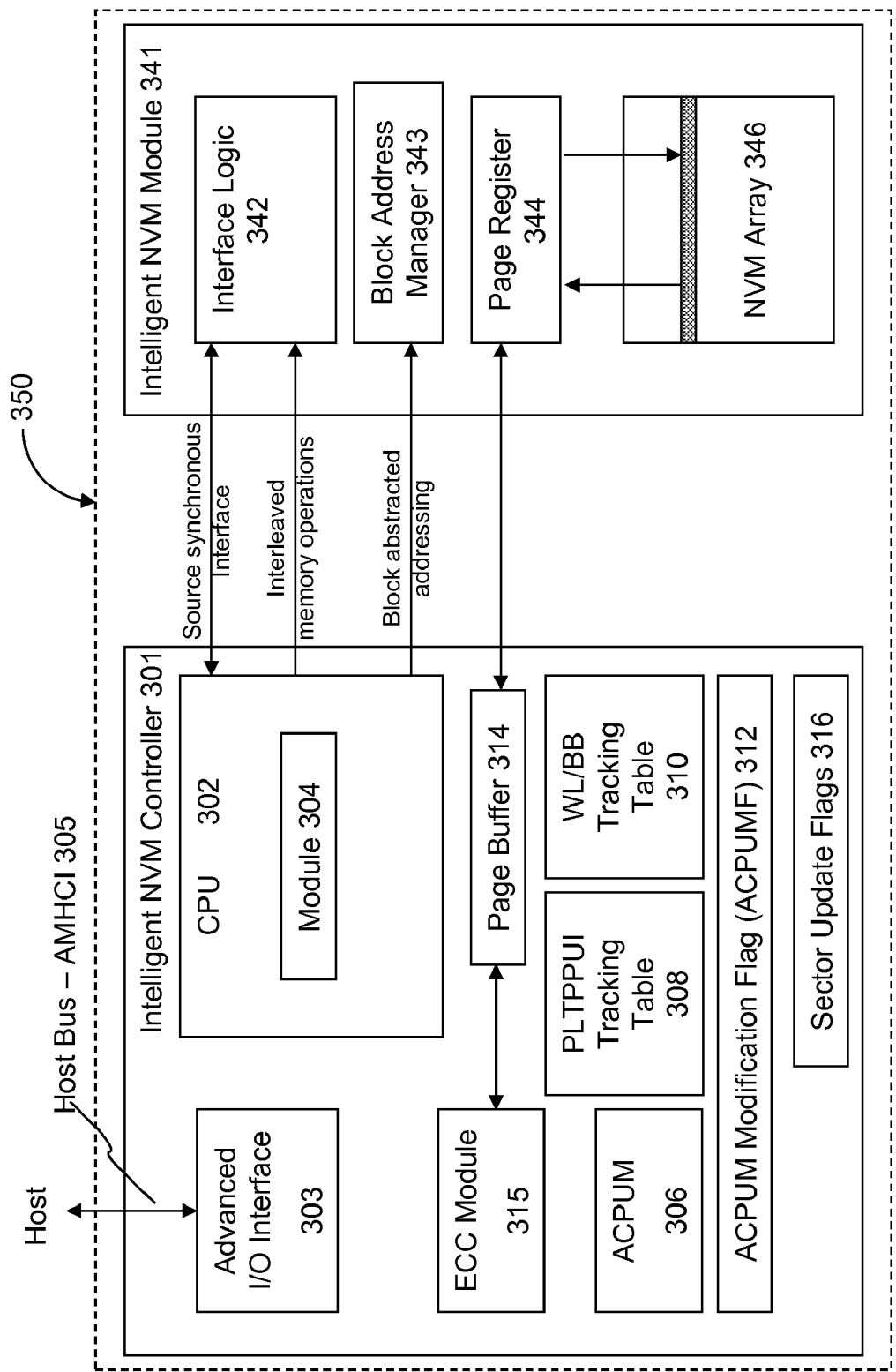
FIG. 3D is a functional block diagram illustrating a single-chip implementation of the NVMD of FIG. 3C, according to an embodiment of the present invention.
Figure 4A:
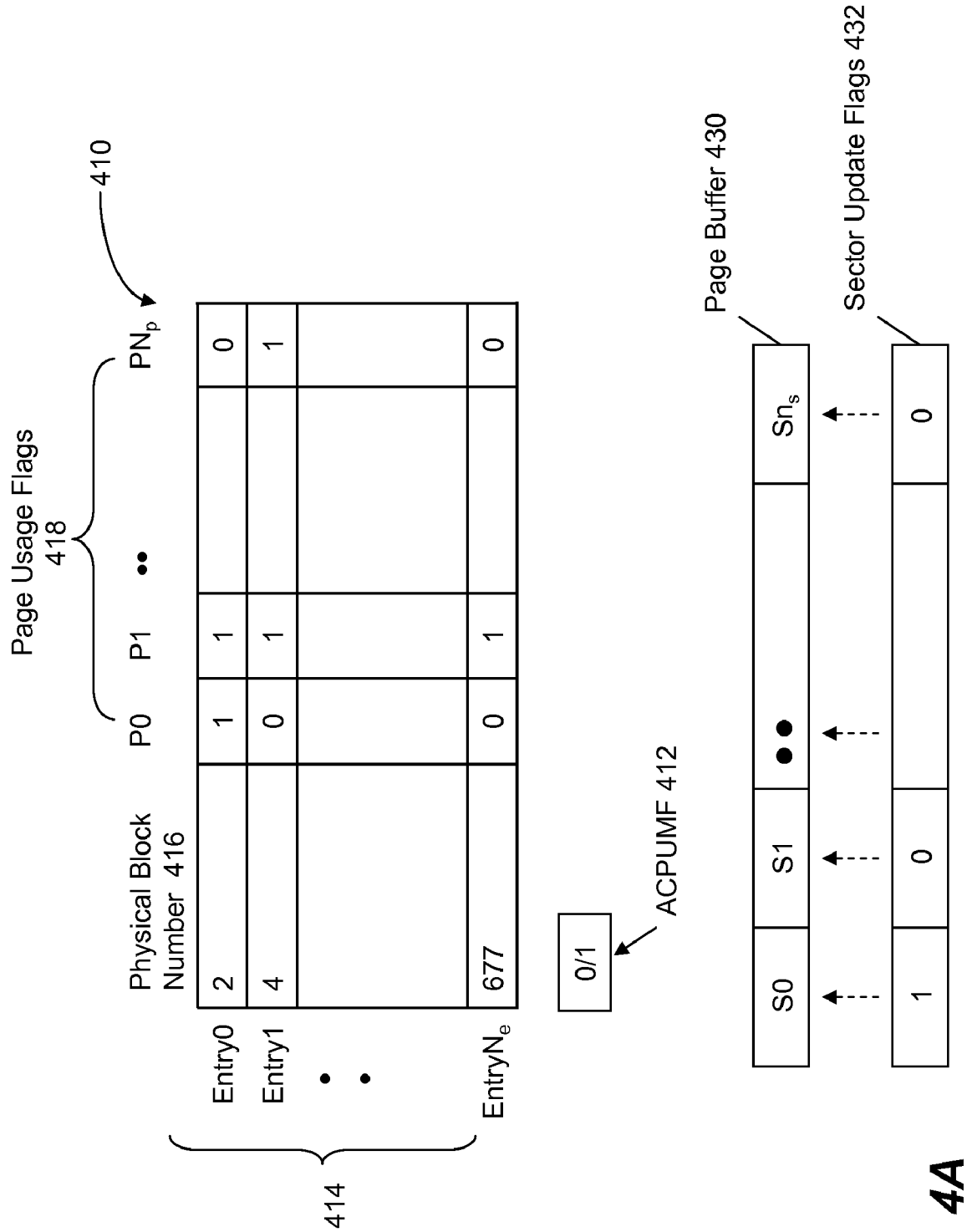
Figure 4B:
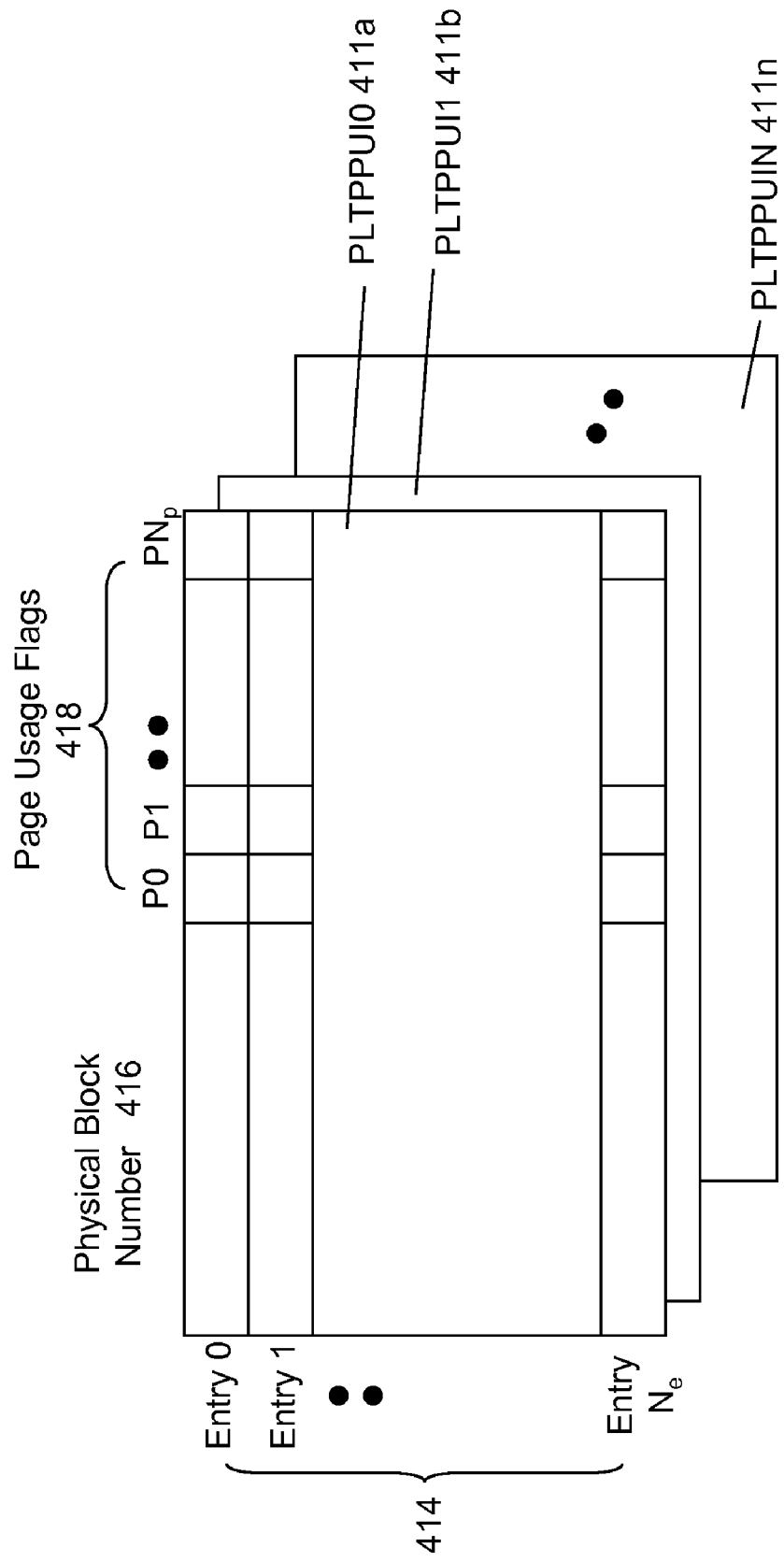

FIG. 3D is a functional block diagram showing a single-chip NVMD 360 in accordance with one embodiment of the present invention. The single-chip NVMD 350 comprises all of the functionalities of the NVMD of FIG. 3C. The single-chip may include a single integrated circuit or die or chip.

FIGS. 4A-4F collectively show exemplary data structures used for managing memory addresses of the flash memory of FIG. 2A in accordance with one embodiment of the present invention. The ACPUM data structure 410 contains $N_e$ rows of entries 414, where $N_e$ is a positive integer. Each row contains a physical block number or address (PBK #) 416 and a plurality of page usage flags 418 associated with the PBK #. The number of pages ($N_p$) is determined by the physical flash memory cell structure and defined by the IMP. ACPUMF 412 contains one bit, which is a toggle switch representing whether the ACPUM 306 has been modified or not. The ACPUMF 412 may be implemented as a register containing either 0 (not modified) or 1 (modified). The page buffer 430 includes a data area containing plurality of sectors (S1, S2, ..., $Sn_s$) and a spare area (not shown in FIG. 4A) containing other information such as ECC. A set of sector update flags 432 is configured to represent respective sectors in the page buffer 430. Each of the sector update flags 432 indicates either a corresponding sector contains a valid data or not. In one implementation, valid data is represented as "1", while initial or stale state as "0". These flags may be implemented in a different logic such as reversing the binary representation. As discussed in the prior sections and shown in FIG. 4B, there are N sets of PLTPPUI 411a-n, where N is a positive integer. The N sets of PLTPPUI 411a-n represent all of the logical blocks in correlation with physical blocks. Only one of the N sets is loaded into the ACPUM 306 at one time.

Each set of the PLTPPUI is stored in the reserved area 206 of the flash memory 201 of FIG. 2A in a data structure 420 shown in FIG. 4C. The contents of each set of PLTPPUI are stored in one page of a physical block. For example, the PLTPPUI0 is stored at one of a plurality of first special logical addresses "0xFFFF0000", which corresponds to the first page (P0) 424a of a physical block 'PBK #1000' 422 initially. Due to the MLC flash memory data programming rules, each page can only be programmed or written once (i.e., NOP=1) and data programming within one block can only be in a ascending page order. The second data programming or write can only be into the second page (P1) 424b until the $n^{th}$ write to the last page (Pn) 424n of the block 'PBK #1000' 422. After that, the next data programming, the $(n+1)^{th}$ write, must be written to the first page (P0) 434 of a new physical block (PBK #1012) 432 just assigned or allocated according to the WL rules. In storing ACPUM 306 into the flash memory, each entry of the ACPUM 306 is written sequentially in the data area 425 of the page. When a first page of a new block is programmed, after the data area has been written, other vital information is written into the spare area 426. The other information include at least the following: a bad block indicator 427, the special logical address 428 issued by the FW for each of the N sets of PLTPPUI and a tracking number 429 for each special logical address. The bad block indicator 427 showing 'FF' means a good block. The first special logical address 442 may be '0xFFFF0000'. And the tracking number (TN) 446 is set to zero for an initial physical block corresponding to each of the first special logical addresses. The tracking number 446 is incremented by one as a new block is assigned or allocated for storing a particular set of PLTPPUI.

FIG. 4D is a diagram illustrating an exemplary data structure 440 of the PLTPPUI tracking table 308 of FIG. 3. The PLTPPUI tracking table 308 contains a plurality of rows representing a plurality of first special logical addresses 442, one for each of the N sets of PLTPPUI. Each of the N rows contains a physical block number 444, a tracking number (TN) 446 and highest page number 448. The highest page number 448 is initially generated at power up reset by checking out the corresponding special LBA value stored in the spare area of each block. Due to the stale blocks may not erased when power is turned off unexpectedly, it may have several blocks with the same special LBA reading. The tracking number 446 is used to identify which block is the most updated block. By examine contents of the most updated block, the highest page number 448 can be determined from advancing to next blank page. The first row of the PLTPPUI tracking table 308 corresponds to the example shown in FIG. 4C.

Similar to the data structure of the PLTPPUI tracking table, an exemplary data structure 450 of a WL/BB tracking table 310 is shown in FIG. 4E. Instead of first special logical addresses for each of the N sets of PLTPPUI, each row is for a second special address 452 of a block of the WL/BB tracking table 310. In one implementation, the second special address 452 may be '0xFFFFFFF0'. An exemplary data structure 460 for storing the WL/BB tracking table in the reserved area of a flash memory is shown in FIG. 4F. Similarly, the MLC flash memory data programming rules dictate the data to be written to a new page for each update. The spare area stores the block indicator 467, the second special logical address 452 and tracking number 456.

Referring now to FIGS. 5A-5E, which collectively show a flowchart illustrating an exemplary process 500 of conducting data transfer requests of the flash memory of FIG. 2A in accordance with one embodiment of the present invention. The process 500 is preferably understood in conjunction with previous figures. The process 500 is performed by the microcontroller 302 with a flash memory controller program module 304 installed thereon.

The process 500 starts in an 'IDLE' state until the microcontroller 302 receives a data transfer request from a host (e.g., the host computing device 109 of FIG. 1B) at 502. Also received in the data transfer request is a logical sector address (LSA), which indicates the location the host wishes to either read or write a sector of data (i.e., 512-byte sector). Based on the parameters defined by the IMP and the physical characteristics of the MLC based flash memory, the received LSA is processed to extract the set, entry, page and sector numbers (see Table 1 for an example) included therein. After the received LSA has been processed, the process 500 moves to decision 504. It is determined whether the ACPUM 306 has been loaded with a set of PLTPPUI that covers the received LSA. If 'yes', the process 500 reads out the physical block number (PBK #) corresponding to the entry number of the received LSA at 516 before moving to another decision 518, in which it is determined whether the data transfer request is read or write (i.e., program).

If the decision 504 is 'no', the process 500 moves to decision 506. The process 500 checks whether the contents of the page buffer 430 need to be stored. In one implementation, the process 500 checks the sector update flags 432 that correspond to sectors in the page buffer 430. If any one of the flags 432 has been set to 'valid', then the contents of the page buffer 430 must be stored to the corresponding page of the corresponding physical block of the MLC flash memory at 550 (i.e., the decision 506 is 'yes'). Detailed process of step 550 is shown and described in FIG. 5D. Although the changes in ACPUM may not updated to tracking records in flash memory in the case of powering off unexpectedly, at power up reset, firmware can base on the LBA value stored in the spare area of each block to reconstruct the ACPUM and PLTPPUI. After the contents of the page buffer 430 have been stored, the process 500 sets the ACPUM modification flag (ACPUMF) 412 to a 'modified' status at 508. In other words, the ACPUM 306 has been modified and needs to be stored in the flash memory in the future. Then the process 500 moves to yet another decision 510.

Otherwise if 'no' at decision 506, the process 500 moves the decision 510 directly. It is then determined if the ACPUM 306 has been modified. If 'yes', the process 500 moves to 580, in which, the process 500 writes the contents of the ACPUM 306 to one of a plurality of first special logical addresses (e.g., '0xFFFF0000' for PLTPPUI0, or '0xFFFF0001' for PLTPPUI1, etc.) for storing corresponding set of PLTPPUI in the reserved area of the flash memory. The ACPUM modification flag 412 is reset at the end of 580. Detailed process of step 580 is shown and described in FIG. 5E. Then, at 514, the process 500 loads a corresponding set of PLTPPUI to the ACPUM 306 from the flash memory based on the set number extracted from the received LSA. Once the ACPUM 306 has been loaded, the process 500 reads the physical block number that corresponds to the entry number at 516 before moving to decision 518. If 'no' at decision 510, the process 500 skips step 580 and goes directly to 514.

Figure 5A:
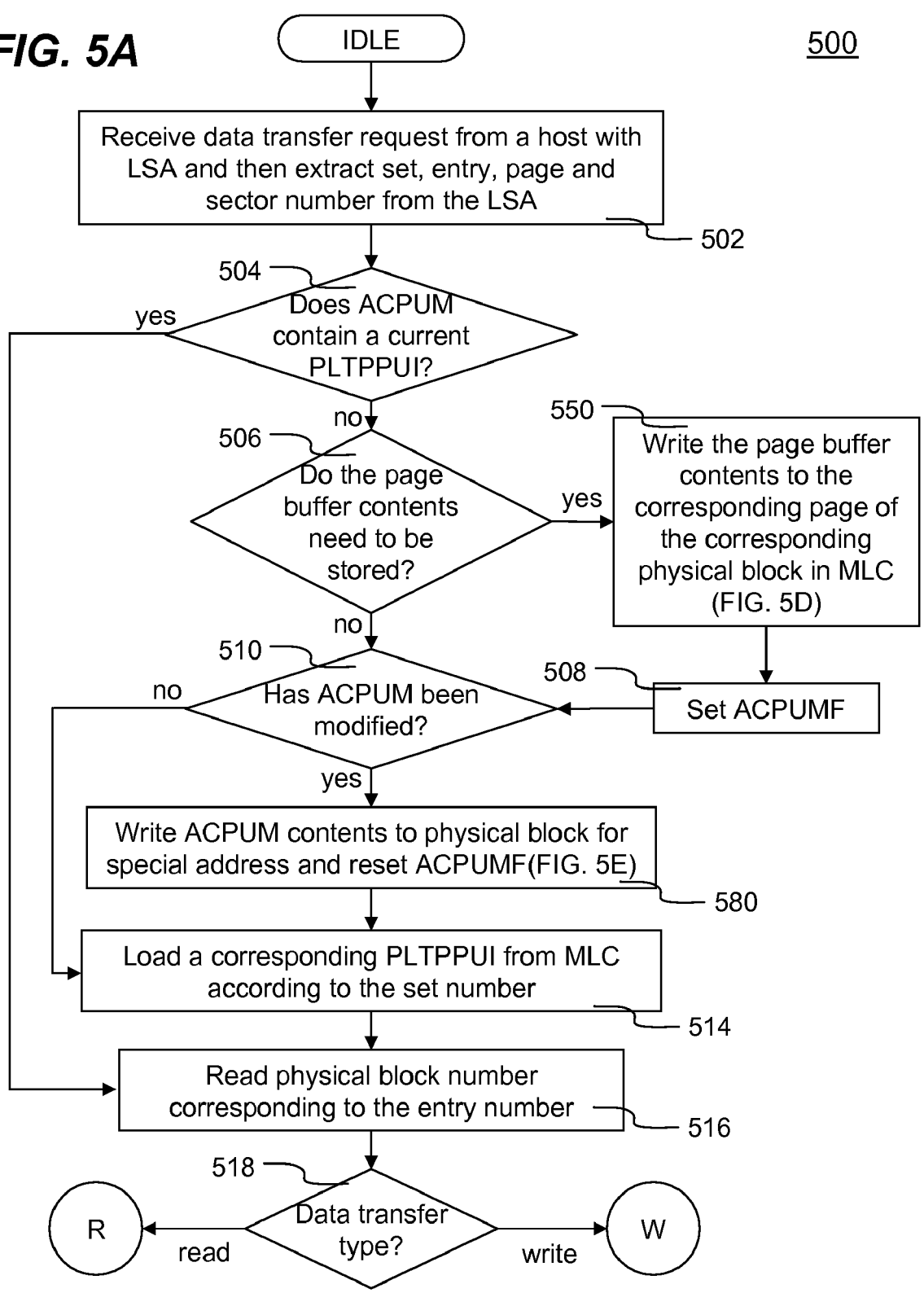
Figure 5B:
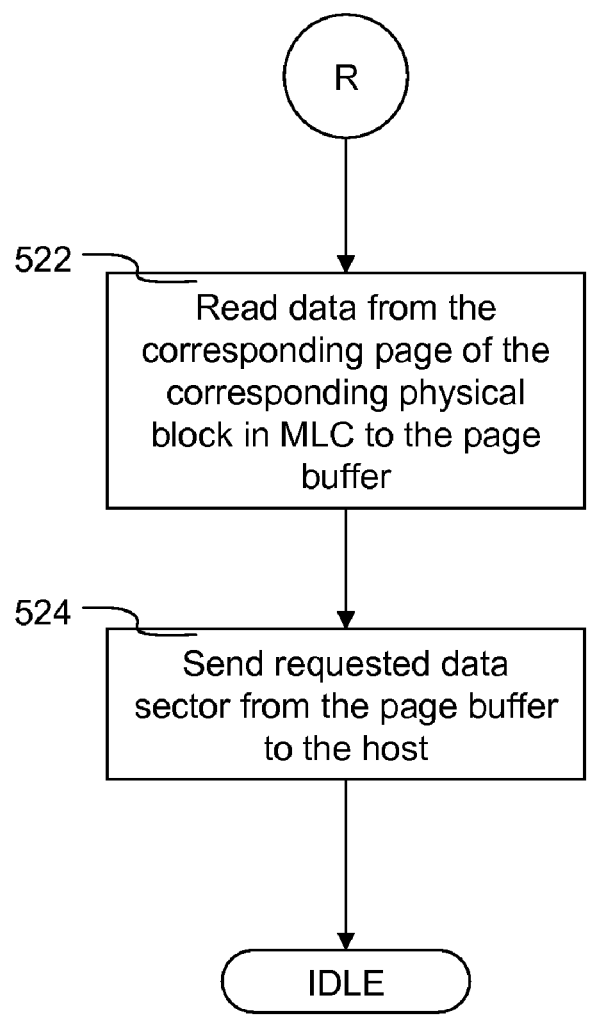

Next, at decision 518, if the data transfer request is a data read request, the process 500 continues with a sub-process 520 shown in FIG. 5B. The process 500 or sub-process 520 reads data from the corresponding page of the physical block in the flash memory to the page buffer 430. The corresponding page number is derived from the received LSA, and the physical block number is obtained through the ACPUM 306 for the entry numbers at 516. Finally, the process 500 sends the requested data sector from the page buffer 430 to the host 109 before going back the 'IDLE' status waiting for another data transfer request.

Figure 5C:
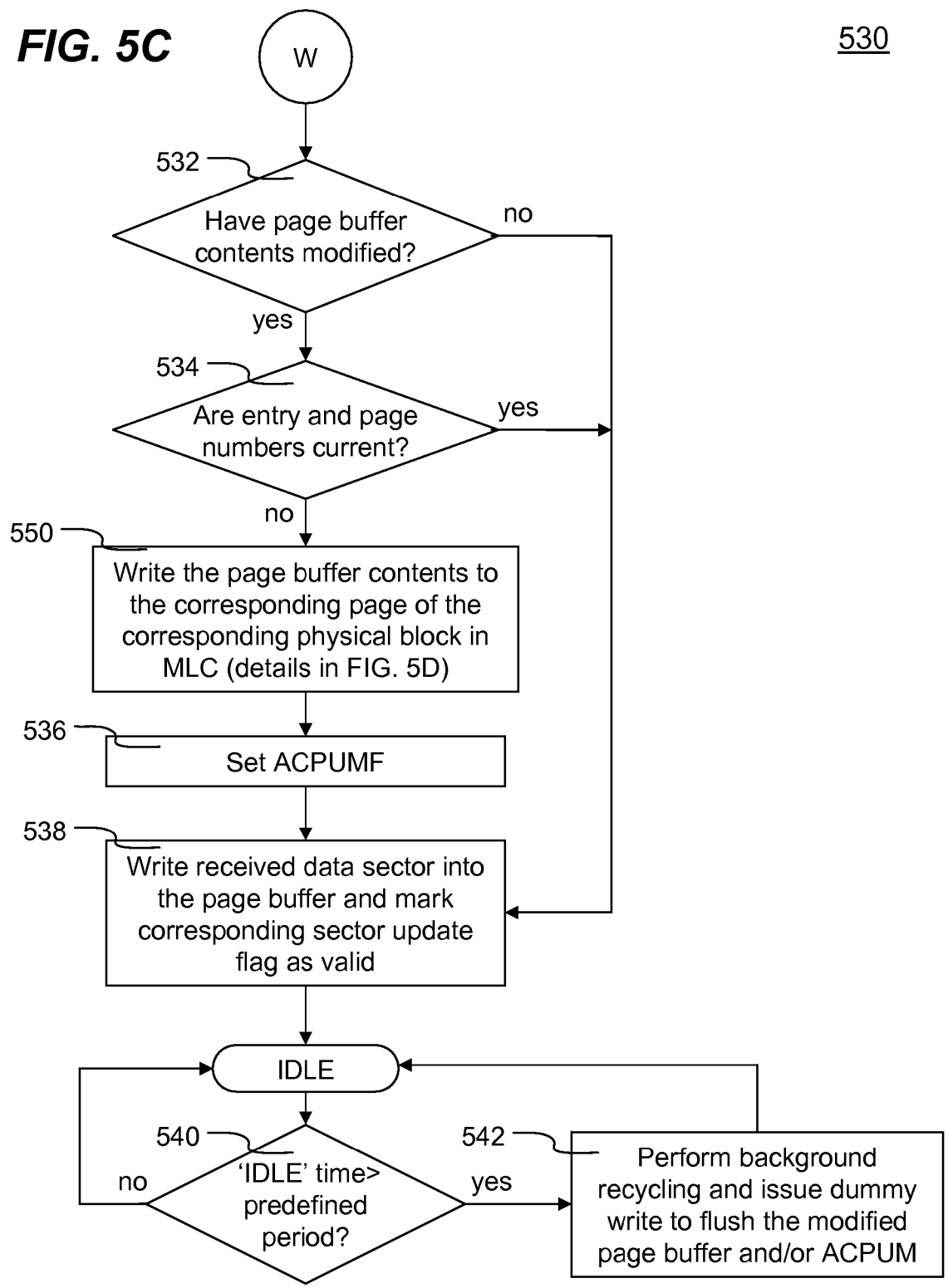

If the data transfer request is a data write or program request, the process 500 continues with a sub-process 530 shown in FIG. 5C. The process 500 or sub-process 530 moves to decision 532, in which it is determined whether the contents of the page buffer 430 have been modified. If 'no', the process 500 writes received data sector into the page buffer 430 according to the sector number derived from the received LSA, and marks the corresponding sector of the sector update flags 432 to indicate valid data in that particular sector has been written in the page buffer 430 at 538. The process 500 then moves back to the 'IDLE' state waiting for another data transfer request.

If 'yes' at decision 532, the process 500 moves to decision 534. It is determined if the received data sector is in the same entry and page numbers. If 'yes', the process 500 writes the received data sector to the page buffer 430 at 538 before going to the 'IDLE'. If 'no' at decision 534, the process 500 writes the page buffer contents to the corresponding page of the physical block of the flash memory at 550. Next, the process 500 sets the ACPUM modification flag 412 to a 'modified' status at 536. Next, at 538, the process 500 writes the received data sector to the page buffer before going back to the 'IDLE' state.

Finally, in additional to managing data read and write requests, the process 500 regularly performs a background physical block recycling process so that the blocks containing only stale data can be reused later. When the process 500 is in the 'IDLE' state, it performs test 540, in which it is determined if the idle time has exceeded a predefine time period. If 'yes', the process 500 performs the background recycling process, which may include issuing a dummy data write request to force the page buffer 430 and/or modified ACPUM 306 to be written to corresponding locations of the flash memory at 542. In one embodiment, the dummy data write/ program command may be issued to rewrite some of seldom touched physical blocks, for example, physical blocks used for storing user application or system program modules.

Figure 5D:
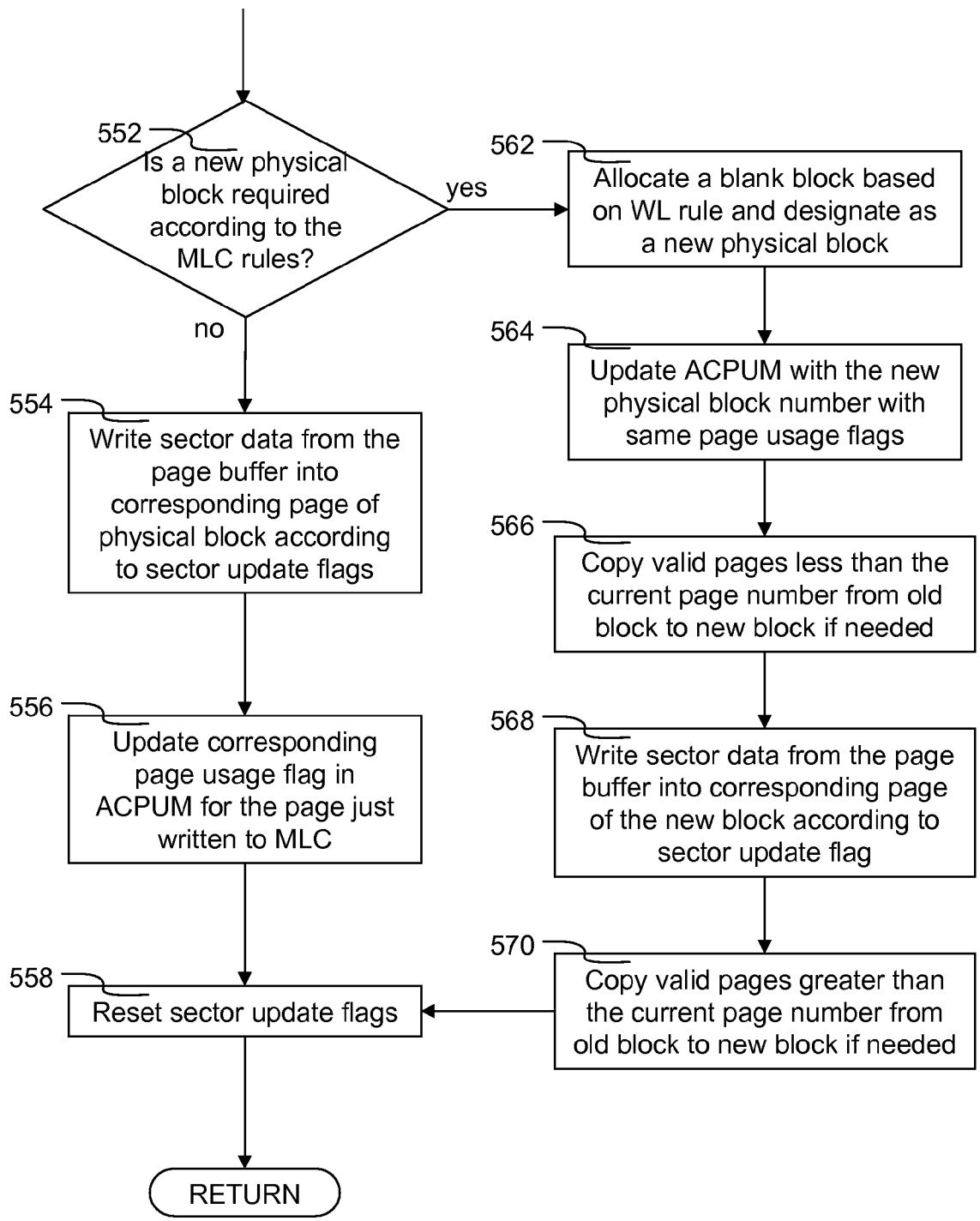

Referring to FIG. 5D, a detailed process of step 550 is shown. First, the process 500 is at decision 552, in which it is determined if a new blank physical block is required for storing the contents of the page buffer 430 based on the MLC based flash memory data programming rules. The rules are as follows: 1) each page can only be programmed once (conventionally referred to as 'NOP=1'); and 2) data programming is performed to a page of a same block in the ascending or sequential order, or each new page must have a high page number in the same block. If 'no' at decision 552, the process 500 writes valid data sectors based on the sector update flags 432 from the page buffer 430 to the page register of the corresponding page of the corresponding physical block of the flash memory at 554. Next, at 556, the process 500 updates the corresponding one of the page usage flags in the ACPUM 306 for the page just written to the flash memory. The process 500 then resets the sector update flags at 558 before returning.

If 'yes' at decision 552, the process 500 searches for a blank physical block based on the wear leveling (WL) rule; once found, the process 500 designates it as a new block at 562. Then, the process 500 updates the ACPUM 306 with the new physical block number for the entry number and keeps the page usage flags the same. It is noted that the entry number is derived from the received LSA. Next, at 566, the process 500 copies all valid pages with page number less than the current page number from the old to the new physical block if needed. The current page number if the page number derived from the received LSA. Then, the process 500 writes the valid data sectors based on the sector update flags 432 from the page buffer 430 to the page register of the corresponding page of the new physical block at 568. Finally if necessary, the process 500 copies all valid pages with page number greater than the current page number from the old to the new physical block at 570. The process 500 resets the sector update flags at 558 before returning.

FIG. 5E is a flowchart illustrating step 580 of the process 500. First, in step 580, the process 500 locates the corresponding physical block in the reserved area of the flash memory using a particular one of the first special logical addresses from the PLTPPUI tracking table 308. The corresponding physical block is configured to store the contents of the current ACPUM 306, which is associated with the first special logical address, for example, '0xFFFF0000' for 'PLTPPUI0', '0xFFFF0001' for 'PLTPPUI1', etc. Next, at decision 584, it is determined whether the physical block is full or not. If 'no', the process 500 writes the contents of the ACPUM 306 to the next page in the physical block at 586. It is noted that the MLC based flash memory data programming rule dictates that only a new higher page in the same block is allowed to be programmed or written. Then the process 500 updates the PLT-PPUI tracking table 308 to reflect that a new page has been written into the physical block by incrementing the highest page count 448 at 588. Finally, before returning at 590, the process 500 resets the ACPUM modification flag 412 to a 'not modified' status as the contents of the ACPUM 306 have been stored to the flash memory.

Referring back to decision 584, if 'yes', the process 500 searches a blank physical block as a new physical block (e.g., new physical block (PBK #1012) in FIG. 4C) in the reserved area of the flash memory based on the WL rule, and the old physical block (e.g. old physical block (PBK #1000) in FIG. 4C) is sent to a recycling queue for reuse at 592. Next, at 594, the process 500 writes the contents of the ACPUM 306 to the first page (e.g., 'P0' of FIG. 4C) of the new block. After the contents of the ACPUM have been stored in to the data area of the first page, the tracking number (TN) is incremented by one. Next, at 596, the first special logical address for this particular set of PTLPPUI and the new tracking number (TN) are written into the spare area of the first page. The process 500 then updates the PLTPPUI tracking table 308 with the new physical block number, the tracking number and the highest page number for the current set of PLTPPUI at 598. Before returning, the process 500 resets the ACPUM modification flag 412 to a 'not modified' status at 590.

Figure 6:
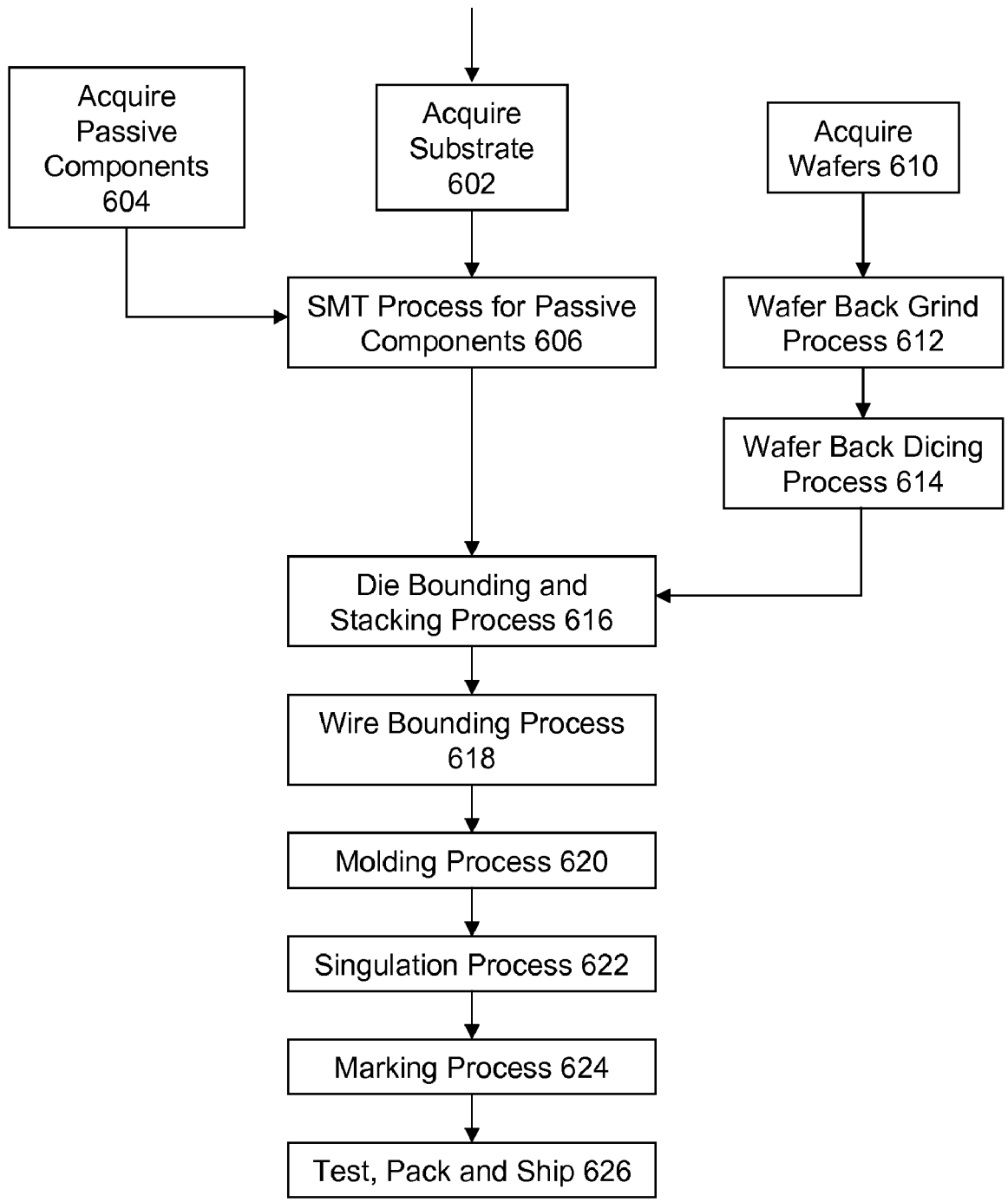
FIG. 6 is a flowchart illustrating an exemplary manufacturing process of the single-chip NVM device of FIG. 3D in accordance with one embodiment of the present invention.
Figure 7A:
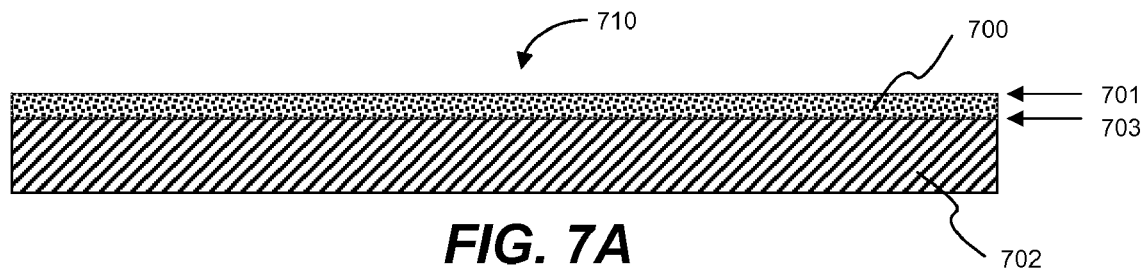
FIGS. 7A-C are cross-sectional views of an exemplary film tape used for adhering stacked NVM dies together in accordance with one embodiment of the present invention.
Figure 7B:
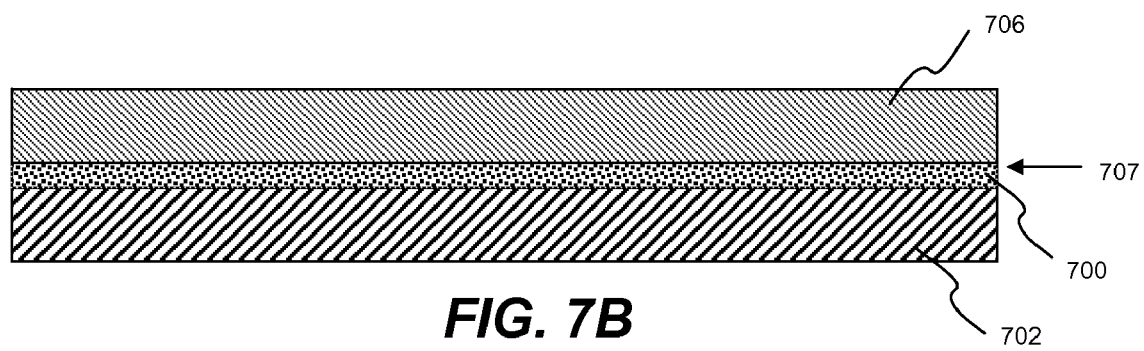
Figure 7C:
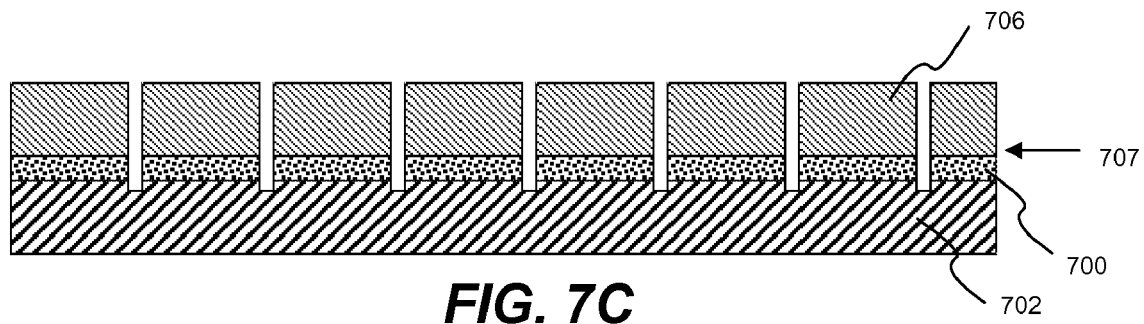

Referring to FIG. 6, which is an exemplary manufacturing process 600 of the single-chip NVMD 360 of FIG. 3D. The process 600 starts by acquiring printed circuit board (PCB) panels at 602 and passive components (e.g., resistors, capacitors, etc.) at 604. The passive components are then mounted on one of the PCB panels at 606. In the meantime, silicon wafers are fabricated at 610. Next a back grind procedure is performed to the wafers at 612. Then the wafers are diced into individual NVM dies (e.g., MLC) at 614. At 616, each of the dies are stacked and bounded with a thin film tape. Details of the thin film tape are shown in FIGS. 7A-C. Next at 618, the wire bounding process is performed to connect various dies with the PCB panel. The passive components, the NVM controller chip and at least one NVM dies are encased by a plastic molding process at 620. Next, the molded single chip is created by a singulation process at 622. Each single-chip is marked with label at 624 and tested at 626.

FIG. 7A is a cross-section view of an exemplary film tape used for adhering two NVM dies together in accordance with one embodiment of the present invention. The thin film tape 710 comprises first 700 and second 702 layers. The first layer 700 is made of adhesive materials and has a thickness of less than 0.1 millimeter (mm). The second layer 702 is made of electronic grade roll sheet, which possesses little or no pockets for entrapping air. Top surface 703 of the second layer 702 comprises a non-sticky smooth surface which can be adhered to one surface of the first layer 700. The other surface of the first layer 700 is adhered to bottom side 707 of a wafer 706 (e.g., wafer for NVM dies) after the wafer has been processed through a back grinding operation as shown in FIG. 7B. During the wafer singulation process, the wafer is diced into individual dies. Each of the wafers is cut with scribed lines. The depth of the scribed lines is preset to 5% of the total depth of the second layer 102 as shown in FIG. 3C.

Figure 8A:
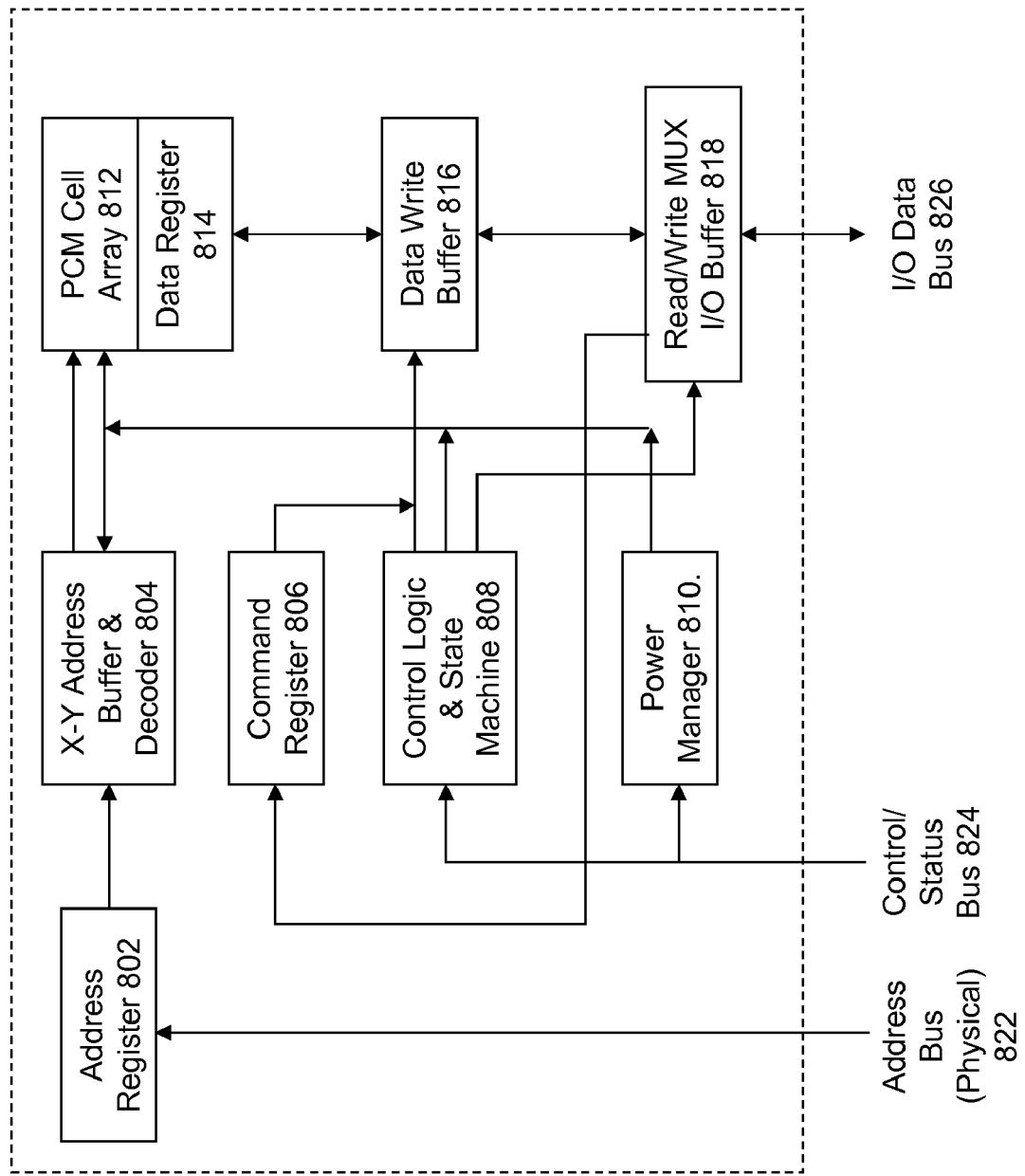
FIGS. 8A-B are functional block diagrams showing salient components of two exemplary NVMDs using phase-change random memory in accordance with one embodiment of the present invention.
Figure 8B:
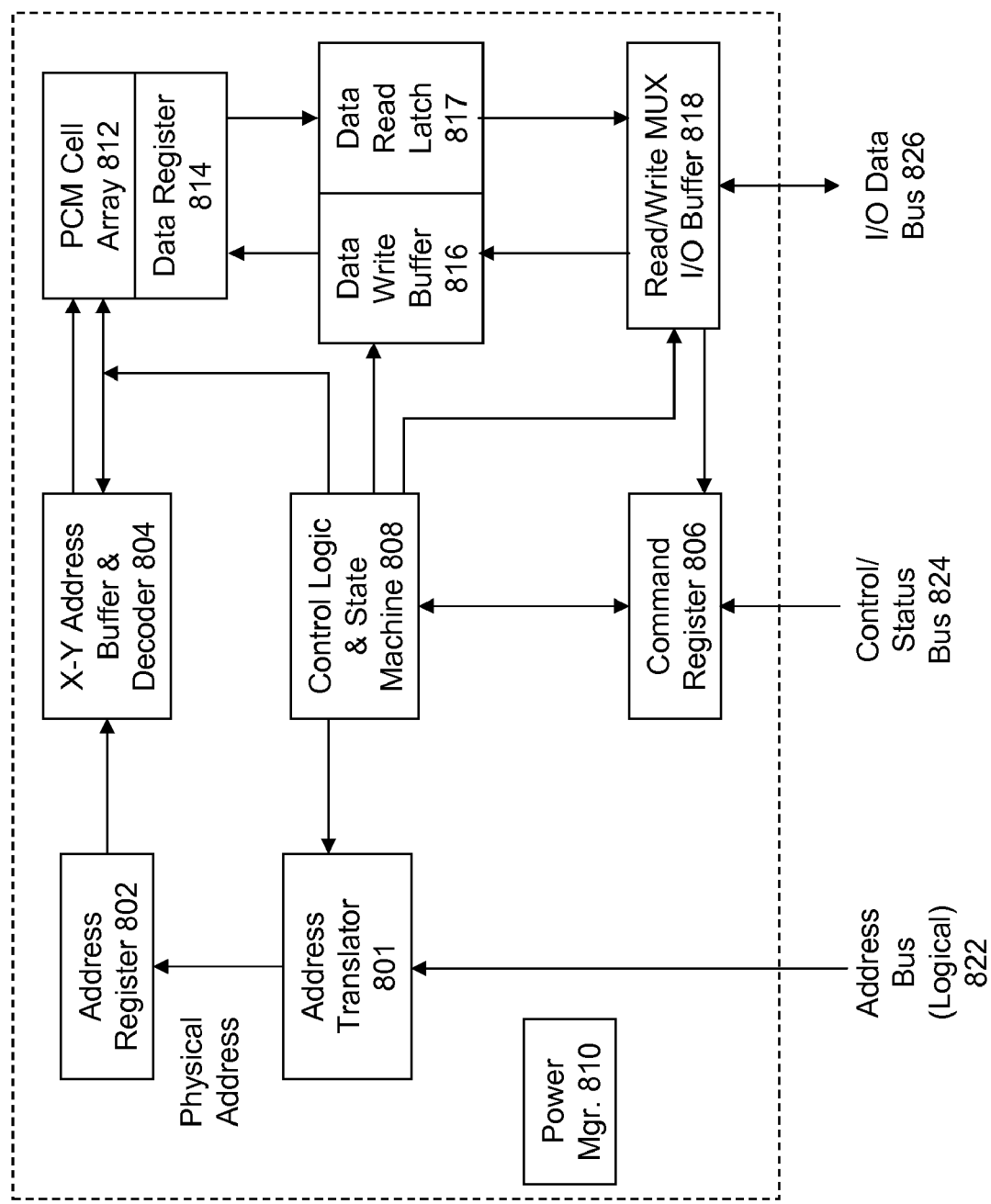

Other exemplary alternative embodiments are shown in the following figures. FIGS. 8A and 8B are block diagrams showing salient components of first 800 and second 850 exemplary phase-change random access memory (PCM) based NVM devices in accordance with one embodiment of the present invention. The first PCM device 800 is a byte-addressable, while the second device 850 is a sector addressable.

The first PCM base NVMD 800 comprises an address register 802, an X-Y address buffer and decoder 804, a control logic and state machine 808, a command register 806, a power manager 810, at least one PCM cell array 812, a data register 814, a data write buffer 816 and a read/write multiplexer (MUX) as input/output buffer 818. The address register 802 is configured to receive a byte address via the address bus 822 from a host computer system (not shown). The X-Y address buffer/decoder 804 is configured to convert the received address to a particular location of the PCM cell array 812 based on the physical layout. The control logic/state machine 808 is configured to receive commands via the control and status bus 824. The command register 806 is configured to function together with the control logic and state machine 808. The power manager 810 is configured to manage the power through the control bus 824 from the host. The at least one PCM cell array 812 is configured to store data. The data register 814 is configured to allow the PCM cell array 812 to be efficiently handle data exchanges with the data write buffer 816. The read/write MUX 818 is configured to perform data input and output via the input/output (I/O) bus 826.

The second PCM device 850 comprises substantially similar components with the first PCM device 800. The difference is an additional address translator 801, which is configured to receive block address (e.g., logical block address) and convert to a physical address (e.g., sector address). Each sector generally consists of 512 bytes. There is also a data read latch 817 configured to interact with the data register 814 and the read/write MUX 818.

Figure 9:
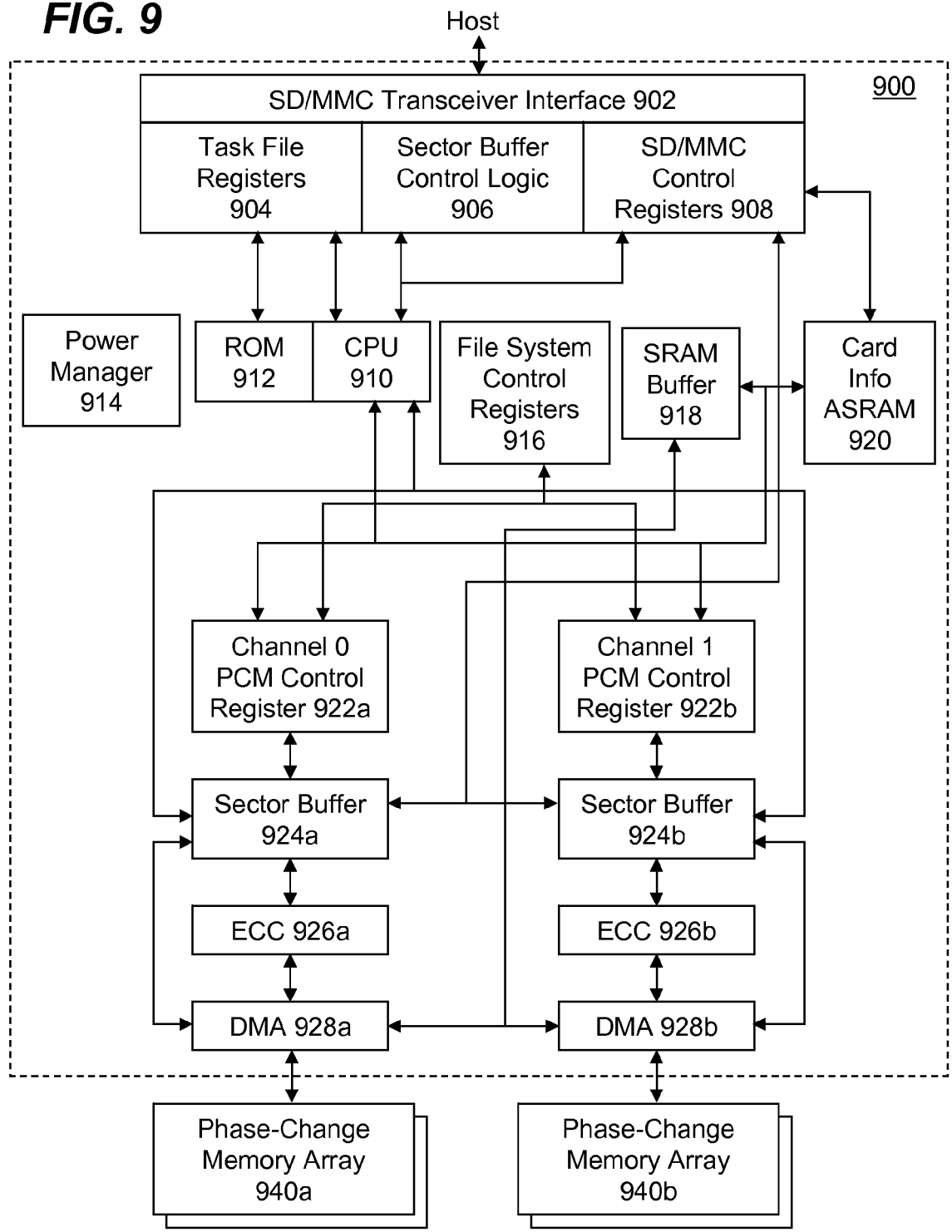
FIG. 9 is a functional block diagram showing salient components of an exemplary NVMD using phase-change random access memory, according to another embodiment of the present invention.

In another embodiment, FIG. 9 shows another exemplary PCM device that includes a dual-channel SD/MMC controller 900 together with phase-change memory arrays 940a-b. The SD/MMC controller 900 comprises a SD/MMC transceiver interface 902, a task file register 904, a sector buffer control logic 906, SD/MMC control registers 908, a CPU 910, a read-only memory (ROM) 912, a power manager 914, file system control registers 916, a static random access memory (SRAM) buffer 918 and an asynchronous SRAM 920. The SRAM buffer 918 is configured to store PCM command status. The ASRAM 920 is configured to store SD/MMC information.

For each of the dual channels, the SD/MMC controller 900 comprises a PCM control register 922a-b, a sector buffer 924a-b, an ECC module 926a-b, a direct memory access (DMA) engine 928a-b. The DMA engine 928a-b is configured to phase-change memory programming. The ECC module 926a-b is configured to create error correction code and to detect and correct data error in the sector buffer 924a-b if possible.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas the MLC based NVMD has been shown and described to comprise four MLC chips with two parallel data channels, different combinations may be used to form other NVMDs, or example, four, eight or more data channels, or eight, sixteen or more MLC chips. Furthermore, whereas a single-chip implementation of NVMD has been shown using one manufacturing process, other equivalent procedures may be used to accomplish the same. Whereas phase-change random access memory has been shown and described as either byte-addressable or sector-address addressable. Other size aggregation or partition schemes may be used for different access of the phase-change memory. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A single-chip non-volatile memory device (NVMD) comprising:
    a high-speed internal bus with a plurality of components coupled thereupon; the components includes:
    an advanced input/output interface logic configured to facilitate data and control signals, to and from a host computer system via a host bus;
    a central processing unit (CPU) configured to manage one or more data transfer operations between the host computer system and the single-chip NVMD;
    at least one non-volatile memory (NVM), each including a page register configured to conduct one or more data exchanges with a plurality of parallel data buffers, and a reserved area of the at least non-volatile memory is configured to store N sets of partial logical-to-physical address and page usage information (PLTPPUI), where N is a positive integer, wherein each of the data changes is managed by the CPU through a scheme based on source synchronous interface, data interleaving and block abstracted addressing;
    a block address manager configured to ensure a physical address of the at least one NVM is converted to a transformed address accessible by the CPU; and
    an address correlation and page usage memory (ACPUM) configured to hold one set of the N sets of PLTPPUI such that said one set is pertinent to a particular one of the data transfer operations between the CPU and the at least one NVM.

2. The single-chip NVMD of claim 1, further comprises an error correction code module coupling to the internal bus configured for detecting and correcting data errors in said one or more data exchanges between the plurality of data buffers and the page register of the NVM.

3. The single-chip NVMD of claim 2, further comprises a wear leveling logic coupling the internal bus configured to ensure even usage of the at least one NVM.

4. The single-chip NVMD of claim 1, wherein the host bus is based on advanced memory host control interface (AMHCI) in conjunction with at least one industry standard.

5. The single-chip NVMD of claim 4, wherein the at least one industry standard includes Universal-Serial Bus(USB), Secure Digital, Serial (SD), Micro SD, Multi-Media Card (MMC), Compact Flash (CF), Memory Stick (MS), PCI-Express, a Integrated Drive Electronics (IDE), Serial Advanced Technology Attachment (SATA), Parallel SATA, Radio Frequency Identification (RFID), fiber channel or optical connections.

6. The single-chip NVMD of claim 1, further comprises random access memory (RAM) and read-only memory (ROM) coupling to the CPU.

7. The single-chip NVMD of claim 1, wherein the transformed address comprises a sector address, each sector includes 512 bytes.

8. The single-chip NVMD of claim 1, wherein the at least one NVM includes Multi-Level Cell flash memory, phase-change memory, Single-Level Cell flash memory, Magnetoresistive random access memory, Ferroelectric random access memory, or Nano random access memory.

9. The single-chip NVMD of claim 1, wherein the at least one NVM comprises a plurality of NVM integrated circuits (ICs), each of the ICs contains at least two dies and each of the dies includes at least two planes.

10. The single-chip NVMD of claim 8, wherein the plurality of the NVM ICs is stackedly connected to each other using with a film tape therebetween during manufacturing process.

11. The single-chip NVMD of claim 9, wherein the film tape includes a first layer of adhesive material and a second layer of electronic plastic roll sheet.

12. The single-chip NVMD of claim 1, wherein said single-chip NVMD is encased in a plastic mold.

13. A non-volatile memory (NVM) device comprising:
an intelligent NVM controller including an advanced input/output (I/O) interface logic, a central processing unit (CPU), an address correlation and page usage memory (ACPUM), a plurality of parallel data buffers, the advanced I/O interface logic is configured to facilitate data and control signals, to and from a host computer system via a host bus, the CPU is configured to manage one or more data transfer operations between the host computer system and the NVM device; and
an intelligent NVM module coupling to and controlled by the intelligent NVM controller, the intelligent NVM module includes at least one non-volatile memory (NVM), an interface logic and a block address manager, each of the at least one NVM includes a page register configured to conduct one or more data exchanges with the plurality of parallel data buffers via a scheme based on source synchronous interface and interleaved data operations, wherein the block address manager is configured to ensure a physical address of the at least one NVM is converted to a transformed address accessible to the intelligent NVM controller, and a reserved area of the at least non-volatile memory is configured to store N sets of partial logical-to-physical address and page usage information (PLTPPUI), where N is a positive integer;
wherein the ACPUM is configured to hold one set of the N sets of PLTPPUI such that said one set is pertinent to a particular one of the data transfer operations between the CPU and the at least one NVM.

14. The device of claim 13, wherein the intelligent NVM controller further comprises an error correction code module and a wear leveling logic coupling to the internal bus, the error correction code module is configured for detecting and correcting data errors in the data exchanges between the plurality of data buffers and the page register of the NVM, while the wear leveling logic is configured to ensure even usage of the at least one NVM.

15. The device of claim 13, wherein the host bus is based on advanced memory host control interface (AMHCI) in conjunction with at least one industry standard.

16. The device of claim 15, wherein the at least one industry standard comprises Universal-Serial Bus(USB), Secure Digital, Serial (SD), Micro SD, Multi-Media Card (MMC), Compact Flash (CF), Memory Stick (MS), PCI-Express, a Integrated Drive Electronics (IDE), Serial Advanced Technology Attachment (SATA), Parallel SATA, Radio Frequency Identification (RFID), fiber channel or optical connections.

17. The device of claim 13, wherein the at least one NVM includes Multi-Level Cell flash memory, phase-change memory, Single-Level Cell flash memory, Magnetoresistive random access memory, Ferroelectric random access memory, or Nano random access memory.

* * * * *